United States Patent
Bang et al.

(10) Patent No.: US 11,910,672 B2
(45) Date of Patent: Feb. 20, 2024

(54) DISPLAY DEVICE INCLUDING A TOUCH LINE CONNECTED TO TOUCH ELECTRODES THAT OVERLAPS A POWER SUPPLY LINE

(71) Applicant: Samsung Display Co., Ltd., Yongin-Si (KR)

(72) Inventors: Ki Ho Bang, Hwaseong-si (KR); Eun Hye Kim, Namyangju-si (KR); Eun Ae Jung, Hwaseong-si (KR); Won Suk Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/567,548

(22) Filed: Jan. 3, 2022

(65) Prior Publication Data
US 2022/0406869 A1   Dec. 22, 2022

(30) Foreign Application Priority Data

Jun. 22, 2021 (KR) .......................... 10-2021-0080503

(51) Int. Cl.
*H10K 59/131* (2023.01)
*G06F 3/041* (2006.01)
(Continued)

(52) U.S. Cl.
CPC ......... *H10K 59/131* (2023.02); *G06F 3/0412* (2013.01); *G06F 3/04164* (2019.05);
(Continued)

(58) Field of Classification Search
None
See application file for complete search history.

(56) References Cited

U.S. PATENT DOCUMENTS

2008/0055212 A1* 3/2008 Kim ................... H01L 27/3276
345/80
2009/0040408 A1* 2/2009 Ishii .................. G02F 1/136213
349/39
(Continued)

FOREIGN PATENT DOCUMENTS

CN        113157143 A  *  7/2021
KR     20190045897 A  *  5/2019
(Continued)

OTHER PUBLICATIONS

Overlap, 2022, www.vocabulary.com/dictionary/overlap, p. 1 (Year: 2022).*

*Primary Examiner* — Kirk W Hermann
(74) *Attorney, Agent, or Firm* — Innovation Counsel LLP

(57) ABSTRACT

A substrate includes a display area and a non-display area with touch electrodes disposed in the display area, touch lines disposed in the non-display area and connected to the touch electrodes, a first power supply line disposed in the non-display area and having a first power supply voltage applied thereto, and a second power supply line disposed in the non-display area and having a second power supply voltage applied thereto, the second power supply voltage being higher than the first power supply voltage. Any one of the touch lines overlaps at least one of the first power supply line and the second power supply line. The first power supply line overlaps the second power supply line.

17 Claims, 27 Drawing Sheets

(51) Int. Cl.
*H10K 50/844* (2023.01)
*H10K 59/40* (2023.01)
*H10K 59/124* (2023.01)
*G06F 3/044* (2006.01)

(52) U.S. Cl.
CPC ......... *H10K 50/844* (2023.02); *H10K 59/124* (2023.02); *H10K 59/40* (2023.02); *G06F 3/0446* (2019.05)

(56) References Cited

U.S. PATENT DOCUMENTS

| | | | | |
|---|---|---|---|---|
| 2016/0126262 | A1* | 5/2016 | Tae | H01L 27/1259 |
| | | | | 438/155 |
| 2017/0262109 | A1* | 9/2017 | Choi | H01L 27/1218 |
| 2018/0083211 | A1* | 3/2018 | Lee | H01L 27/3276 |
| 2018/0321793 | A1* | 11/2018 | Kim | G06F 3/0418 |
| 2019/0341439 | A1* | 11/2019 | Choi | G09G 3/3291 |
| 2020/0150847 | A1 | 5/2020 | Jang et al. | |
| 2021/0064172 | A1* | 3/2021 | Lee | G06F 3/0446 |
| 2021/0134936 | A1* | 5/2021 | Chang | G09G 3/20 |
| 2022/0197441 | A1* | 6/2022 | Choi | G06F 3/0412 |
| 2022/0206610 | A1* | 6/2022 | Kim | G06F 3/0446 |

FOREIGN PATENT DOCUMENTS

| | | | |
|---|---|---|---|
| KR | 10-2020-0116568 A | | 10/2020 |
| KR | 20220093435 A | * | 7/2022 |

* cited by examiner

DISPLAY DEVICE INCLUDING A TOUCH LINE CONNECTED TO TOUCH ELECTRODES THAT OVERLAPS A POWER SUPPLY LINE

CROSS-REFERENCE TO RELATED APPLICATION

This application claims priority to Korean Patent Application No. 10-2021-0080503 filed on Jun. 22, 2021, and all the benefits accruing therefrom under 35 U.S.C. § 119, the content of which in its entirety is herein incorporated by reference.

BACKGROUND

1. Field of the Disclosure

The present disclosure relates to a display device.

2. Description of the Related Art

As the information society develops, the demand for display devices for displaying images has increased and diversified. For example, display devices have been applied to various electronic devices such as smartphones, digital cameras, laptop computers, navigation devices, and smart televisions.

The display device may include pixels emitting predetermined light, scan lines, data lines, and power lines for driving the pixels, a scan driver outputting scan signals to the scan lines, and a display driver outputting data voltages to the data lines. In this case, data fan-out lines may be disposed between the data lines and the display driver, and scan fan-out lines may be disposed between the scan driver and the display driver.

In addition, the display device may include a touch sensing part for sensing a touch by a user, as one of input interfaces. The touch sensing part senses the touch by the user by including a plurality of touch electrodes driven in a capacitive manner. The plurality of touch electrodes may be connected to a plurality of touch lines, respectively.

SUMMARY

According to an embodiment of the present disclosure, a display device includes a substrate including a display area and a non-display area, touch electrodes disposed in the display area, touch lines disposed in the non-display area and connected to the touch electrodes, a first power supply line disposed in the non-display area and having a first power supply voltage applied thereto, and a second power supply line disposed in the non-display area and having a second power supply voltage applied thereto, the second power supply voltage being higher than the first power supply voltage. Any one of the touch lines overlaps at least one of the first power supply line and the second power supply line. The first power supply line overlaps the second power supply line.

The touch line may overlap the first power supply line and the second power supply line.

The touch line may overlap the first power supply line.

The display device may further include data lines disposed in the display area, and data fan-out lines disposed in the non-display area and connected to the data lines. Any one of the data fan-out lines may overlap at least one of the first power supply line and the second power supply line.

The data fan-out line may overlap the touch line.

The display device may further include scan lines disposed in the display area, a scan driver disposed in the non-display area and applying scan signals to the scan lines, and scan fan-out lines disposed in the non-display area and connected to the scan driver. Any one of the scan fan-out lines may overlap at least one of the first power supply line and the second power supply line.

The scan fan-out line may overlap the touch line.

The first power supply line may include a first sub power supply line disposed on the substrate and a second sub power supply line disposed on the first sub power supply line. The second power supply line may include a third sub power supply line disposed on the substrate and a fourth sub power supply line disposed on the third sub power supply line.

The second sub power supply line may overlap the third sub power supply line.

The first sub power supply line may overlap the fourth sub power supply line.

The first sub power supply line and the third sub power supply line may include the same material. The second sub power supply line and the fourth sub power supply line may include the same material.

The first power supply line may further include a fifth sub power supply line disposed on the second sub power supply line.

The fifth sub power supply line may overlap the third sub power supply line.

The first sub power supply line may overlap the fourth sub power supply line.

The first sub power supply line and the third sub power supply line may include the same material. The fifth sub power supply line and the fourth sub power supply line may include the same material.

According to an embodiment of the present disclosure, a display device includes a substrate, a first active layer disposed on the substrate and including a channel region, a first gate insulating film disposed on the first active layer, a first gate electrode disposed on the first gate insulating film and overlapping the channel region of the first active layer, a first interlayer insulating film disposed on the first gate electrode, a capacitor electrode disposed on the first interlayer insulating film and overlapping the first gate electrode, a second interlayer insulating film disposed on the capacitor electrode, a first sub power supply line and a third sub power supply line disposed on the second interlayer insulating film, a second sub power supply line disposed on the first sub power supply line, and a fourth sub power supply line disposed on the third sub power supply line. At least one of the first sub power supply line and the second sub power supply line overlaps at least one of the third sub power supply line and the fourth sub power supply line.

The display device may further include a first planarization film disposed between the third sub power supply line and the fourth sub power supply line, and a second planarization film disposed on the fourth sub power supply line.

According to an embodiment of the present disclosure, a display device includes a substrate, a first active layer disposed on the substrate and including a channel region, a first gate insulating film disposed on the first active layer, a first gate electrode disposed on the first gate insulating film and overlapping the channel region of the first active layer, a first interlayer insulating film disposed on the first gate electrode, a capacitor electrode disposed on the first interlayer insulating film and overlapping the first gate electrode, a second interlayer insulating film disposed on the capacitor electrode, a first sub power supply line and a third sub power supply line disposed on the second interlayer insulating film, a second sub power supply line disposed on the first sub power supply line, a fourth sub power supply line disposed on the third sub power supply line, and a fifth sub power supply line disposed on the second sub power supply line. At least one of the first sub power supply line and the fifth sub power supply line overlaps at least one of the third sub power supply line and the fourth sub power supply line.

The display device may further include a first planarization film disposed between the third sub power supply line and the fourth sub power supply line, a second planarization film disposed on the fourth sub power supply line, and a third planarization film disposed on the fifth sub power supply line.

The display device may further include an encapsulation layer disposed on the third planarization film and including a first encapsulation inorganic film, an encapsulation organic film, and a second encapsulation inorganic film, and a dam for preventing overflow of the encapsulation organic film. The first sub power supply line, the second sub power supply line, and the fifth sub power supply line overlap the dam.

According to an embodiment of the disclosure, since the first power supply line and the second power supply line overlap each other in the non-display area disposed in a lower side of the display panel, the first power supply line or the second power supply line may be disposed between the touch line and the data fan-out line or the scan fan-out line. Therefore, it is possible to prevent a parasitic capacitance from being formed between the touch line and the data fan-out line and between the touch line and the scan fan-out line. Therefore, it is possible to prevent the touch driving signal or the touch sensing signal of the touch line from being affected by the data voltage of the data fan-out line or being affected by the scan control signal of the scan fan-out line. Therefore, it is possible to prevent occurs a touch detection errors.

Also, according to an embodiment of the disclosure, the first power supply line and the second power supply line may overlap each other in the fan-out line area. Since the first planarization film and the second planarization film are disposed between the fifth sub power supply line and the third sub power supply line in the third direction, the distance between the fifth sub power supply line and the third sub power supply line in the third direction can be increased as far as possible. Therefore, it is possible to reduce burn according to a potential difference between the high potential voltage of the third sub power supply line and the low potential voltage of the fifth sub power supply voltage.

Furthermore, according to an embodiment of the disclosure, the first sub power supply line and the fourth sub power supply line may overlap each other in the fan-out line area. A first planarization layer and a second planarization layer may be disposed between the first sub power supply line and the fourth sub power supply line in the third direction. Therefore, the distance the first sub power supply line and the fourth sub power supply line in the third direction can be increased as far as possible. Therefore, it is possible to reduce the occurrence of burn according to a potential difference between the high potential voltage of the fourth sub power supply line and the low potential voltage of the first sub power supply line.

It should be noted that effects of the present disclosure are not limited to those described above and other effects of the present disclosure will be apparent to those skilled in the art from the following descriptions.

BRIEF DESCRIPTION OF THE DRAWINGS

The above and other features of the inventive concept will become more apparent by describing in detail embodiments thereof with reference to the accompanying drawings, in which.

DETAILED DESCRIPTION OF THE EMBODIMENTS

Figure 1:
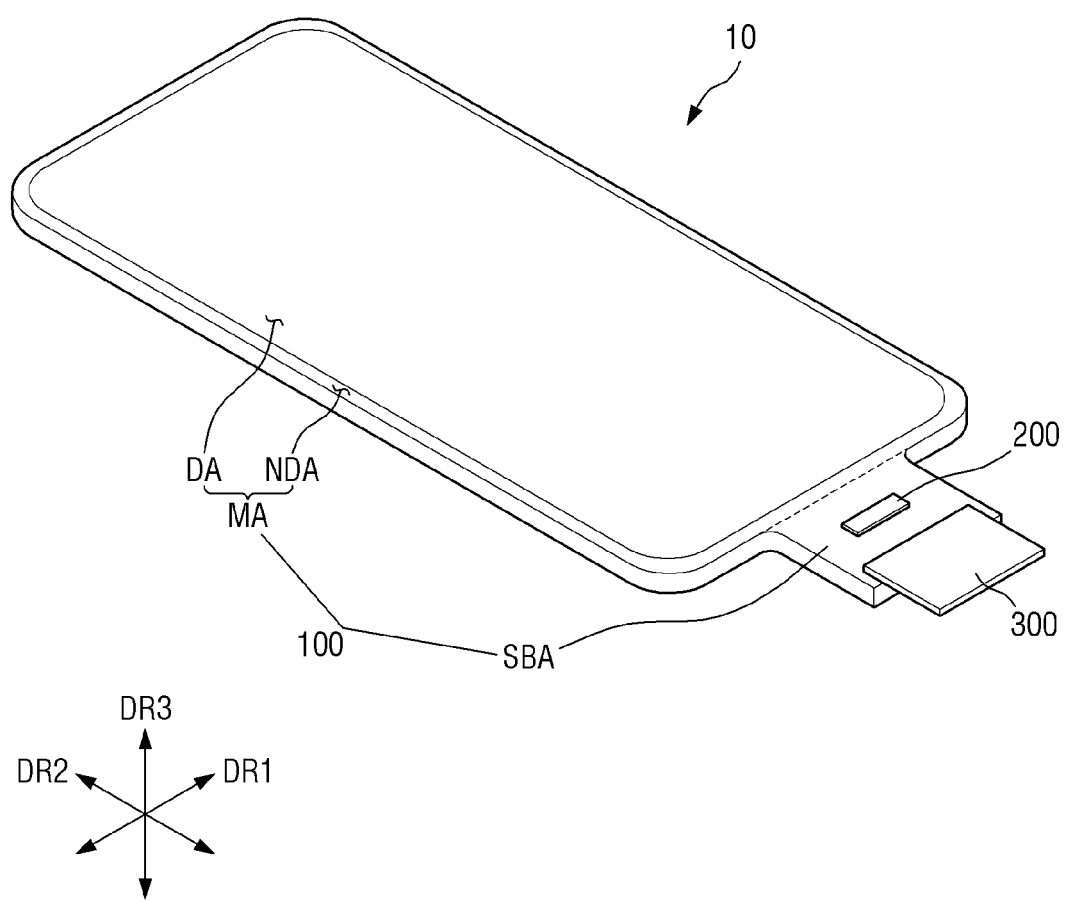
FIG. 1 is a perspective view illustrating a display device according to an exemplary embodiment.

Embodiments of the present disclosure address a problem in which any of a plurality of touch lines overlapping a data fan-out line or a scan fan-out line produce a parasitic capacitance between the touch line and the data fan-out line or between the touch line and the scan fan-out line. Due to the parasitic capacitance, a touch signal of the touch line may be affected by a data voltage of the data fan-out line or a scan control signal of the scan fan-out line, and thus, a touch sensing error may occur.

Embodiments of the present disclosure provide a display device capable of preventing a touch signal of a touch line from being affected by a data voltage of a data fan-out line or a scan control signal of a scan fan-out line.

The inventive concept now will be described more fully hereinafter with reference to the accompanying drawings, in which various embodiments are shown. This inventive concept may, however, be embodied in many different forms, and should not be construed as limited to the embodiments set forth herein. Rather, these embodiments are provided so that this disclosure will be thorough and complete, and will fully convey the scope of the inventive concept to those skilled in the art. Like reference numerals refer to like elements throughout.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms "first," "second," "third" etc. may be used herein to describe various elements, components, regions, layers or sections, these elements, components, regions, layers or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting.

As used herein, the word "or" means logical "or" so that, unless the context indicates otherwise, the expression "A, B, or C" means "A and B and C," "A and B but not C," "A and C but not B," "B and C but not A," "A but not B and not C," "B but not A and not C," and "C but not A and not B."

As used herein, the terms "comprises," "comprising," "includes," and "including" mean the presence of stated features, regions, integers, steps, operations, elements, or components, but do not preclude the presence or addition of one or more other features, regions, integers, steps, operations, elements, components, or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the inventive concept present disclosure will be described in detail with reference to the accompanying drawings.

FIG. 1 is a perspective view illustrating a display device according to an exemplary embodiment.

Referring to FIG. 1, a display device 10 is a device that displays a moving image or a still image, and may be used as a display screen of each of various products such as a television, a laptop computer, a monitor, a billboard, and Internet of Things (JOT) as well as portable electronic devices such as a mobile phone, a smartphone, a tablet personal computer (PC), a smartwatch, a watch phone, a mobile communication terminal, an electronic organizer, an electronic book, a portable multimedia player (PMP), a navigation device, and an ultra mobile PC (UMPC).

The display device 10 may be a light emitting display device such as an organic light emitting diode display using an organic light emitting diode, a quantum dot light emitting display device including a quantum dot light emitting layer, an inorganic light emitting display device including an inorganic semiconductor, and a micro light emitting display device using a micro or nano light emitting diode (micro LED or nano LED). Hereinafter, it has been mainly described that the display device 10 is the organic light emitting display device, but the present disclosure is not limited thereto.

The display device 10 includes a display panel 100, a display driving circuit 200, and a circuit board 300.

The display panel 100 may be formed in a rectangular shape, in plan view, having short sides in a first direction DR1 and long sides in a second direction DR2 crossing the first direction DR1. A corner where the short side in the first direction DR1 and the long side in the second direction DR2 meet may be rounded with a predetermined curvature or may be right-angled. The shape of the display panel 100 in plan view is not limited to the rectangular shape, and may be a polygonal shape, a circular shape, or an elliptical shape. The display panel 100 may be formed to be flat, but is not limited thereto. For example, the display panel 100 may include curved surface parts formed at left and right distal ends thereof and having a constant curvature or a variable curvature. In addition, the display panel 100 may be flexibly formed to be bent, folded, or rolled.

A substrate of the display panel 100 may include a main area MA and a sub-area SBA.

The main area MA may include a display area DA displaying an image and a non-display area NDA which is a peripheral area of the display area DA. The display area DA may include sub-pixels SPX (see FIG. 5) displaying the image. The sub-area SBA may protrude from one side of the main area MA in the second direction DR2.

It has been illustrated in FIG. 1 that the sub-area SBA is unbent, but the sub-area SBA may be bent, and in this case, the sub-area SBA may be disposed on a lower surface of the display panel 100. When the sub-area SBA is bent, the sub-area SBA may overlap the main area MA in a thickness direction DR3 of the substrate SUB. The display driving circuit 200 may be disposed in the sub-area SBA.

The display driving circuit 200 may generate signals and voltages for driving the display panel 100. The display driving circuit 200 may be formed as an integrated circuit (IC) and be attached onto the display panel 100 in a chip on glass (COG) manner, a chip on plastic (COP) manner, or an ultrasonic bonding manner, but is not limited thereto. For example, the display driving circuit 200 may be attached onto the circuit board 300 in a chip on film (COF) manner.

The circuit board 300 may be attached to one end of the sub-area SBA of the display panel 100. Therefore, the circuit board 300 may be electrically connected to the display panel 100 and the display driving circuit 200. The display panel 100 and the display driving circuit 200 may receive digital video data, timing signals, and driving voltages through the circuit board 300. The circuit board 300 may be a flexible film such as a flexible printed circuit board, a printed circuit board, or a chip on film.

Figure 2:
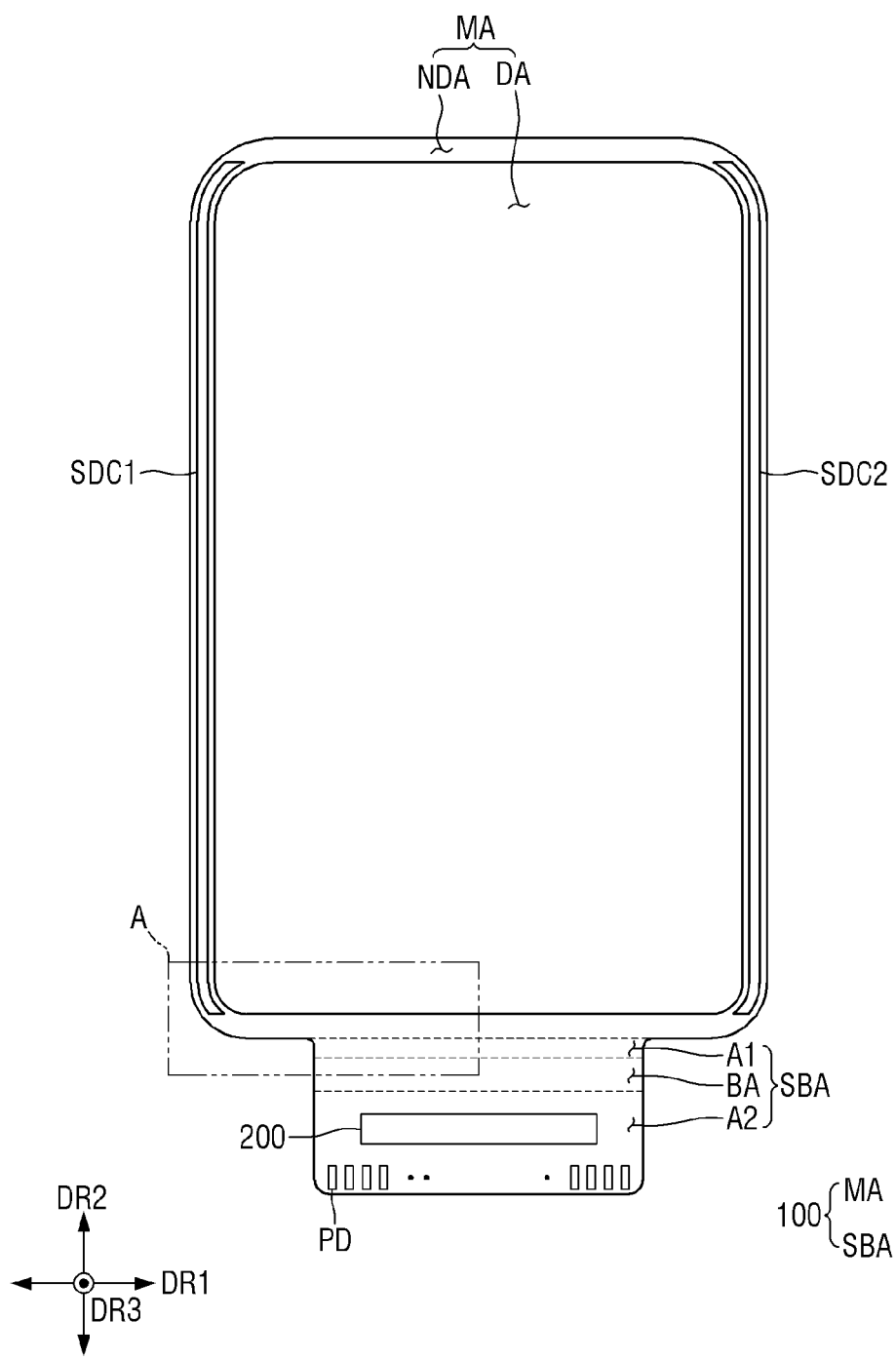
FIGS. 2 and 3 are plan views illustrating the display device according to an exemplary embodiment.
Figure 3:
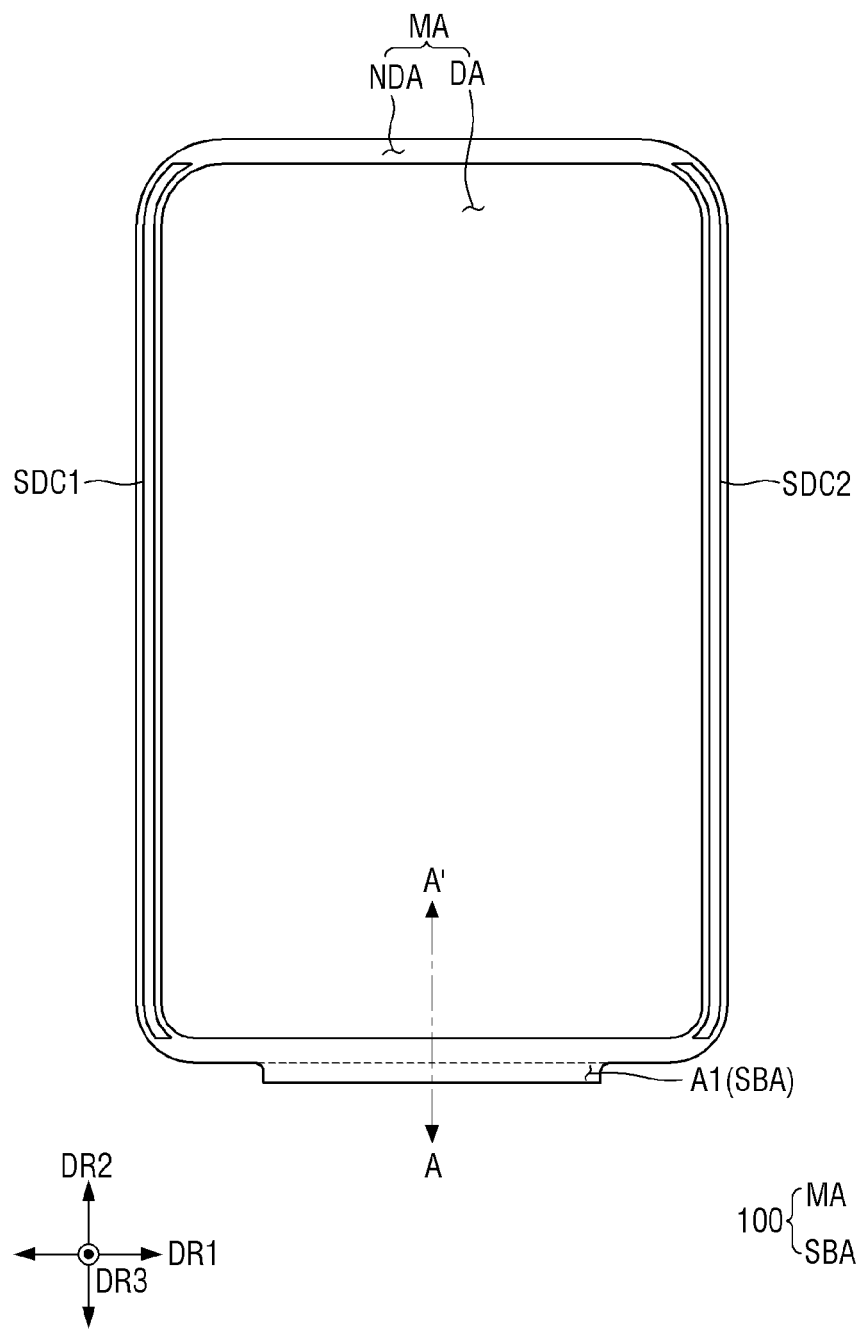
Figure 4:
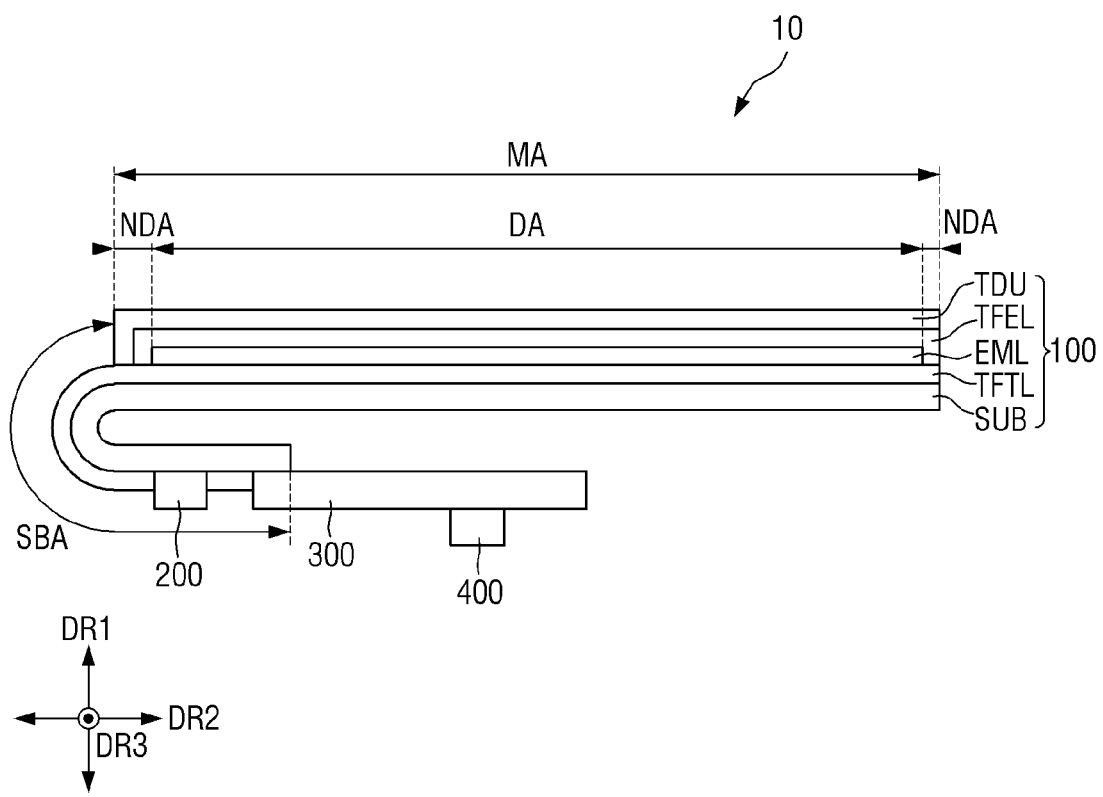
FIG. 4 is a side view illustrating the display device according to an exemplary embodiment.

FIGS. 2 and 3 are plan views illustrating the display device according to an exemplary embodiment. FIG. 4 is a side view illustrating the display device according to an exemplary embodiment.

FIG. 2 illustrates the sub-area SBA as not bent. FIGS. 3 and 4 illustrate the sub-area SBA as bent.

Referring to FIGS. 2 to 4, the display panel 100 may include the main area MA and the sub-area SBA.

The main area MA may include the display area DA displaying the image and the non-display area NDA which is the peripheral area of the display area DA. The display area DA may occupy most of the main area MA. The display area DA may be disposed at the center of the main area MA.

The non-display area NDA may be disposed to neighbor to the display area DA. The non-display area NDA may be an area outside the display area DA. The non-display area NDA may be disposed to surround the display area DA. The non-display area NDA may be an edge area of the display panel 100.

A first scan driver SDC1 and a second scan driver SDC2 may be disposed in the non-display area NDA. The first scan driver SDC1 may be disposed on one side (e.g., a left side) of the display panel 100, and the second scan driver SDC2 may be disposed on the other side (e.g., a right side) of the display panel 100, but the present disclosure is not limited thereto. Each of the first scan driver SDC1 and the second scan driver SDC2 may be electrically connected to the display driving circuit 200 through scan fan-out lines SFL (see FIG. 14). Each of the first scan driver SDC1 and the second scan driver SDC2 may receive a scan control signal from the display driving circuit 200, generate scan signals according to the scan control signal, and output the scan signals to scan lines.

The sub-area SBA may protrude from one side of the main area MA in the second direction DR2. A length of the sub-area SBA in the second direction DR2 may be smaller than a length of the main area MA in the second direction DR2. A length of the sub-area SBA in the first direction DR1 may be smaller than or substantially the same as a length of the main area MA in the first direction DR1. The sub-area SBA may be bent and be disposed below the display panel 100. In this case, the sub-area SBA may overlap the main area MA in a third direction DR3.

The sub-area SBA may include a first area A1, a second area A2, and a bending area BA.

The first area A1 is an area protruding from one side of the main area MA in the second direction DR2. One side of the first area A1 may be in contact with the non-display area NDA of the main area MA, and the other side of the first area A1 may be in contact with the bending area BA.

The second area A2 is an area in which pads PD and the display driving circuit 200 are disposed. The display driving circuit 200 may be attached to driving pads of the second area A2 using a low-resistance and high-reliability material such as an anisotropic conductive film or a self assembly anisotropic conductive paste (SAP). The circuit board 300 may be attached to the pads PD of the second area A2 using a low-resistance and high-reliability material such as an anisotropic conductive film or an SAP. One side of the second area A2 may be in contact with the bending area BA.

The bending area BA is an area that is bent. When the bending area BA is bent, the second area A2 may be disposed below the first area A1 and below the main area MA. The bending area BA may be disposed between the first area A1 and the second area A2. One side of the bending area BA may be in contact with the first area A1, and the other side of the bending area BA may be in contact with the second area A2.

The display panel 100 may include a substrate SUB, a thin film transistor layer TFTL, a light emitting element layer EML, an encapsulation layer TFEL, and a touch sensing part TDU, as illustrated in FIG. 4.

The substrate SUB may be made of an insulating material such as a polymer resin. For example, the substrate SUB may be made of polyimide. The substrate SUB may be a flexible substrate that may be bent, folded, and rolled.

The thin film transistor layer TFTL may be disposed on the substrate SUB. The thin film transistor layer TFTL may be disposed in the main area MA and the sub-area SBA. The thin film transistor layer TFTL includes thin film transistors.

The light emitting element layer EML may be disposed on the thin film transistor layer TFTL. The light emitting element layer EML may be disposed in the display area DA of the main area MA. The light emitting element layer EML includes light emitting elements disposed in light emitting parts.

The encapsulation layer TFEL may be disposed on the light emitting element layer EML. The encapsulation layer TFEL may be disposed in the display area DA and the non-display area NDA of the main area MA. The encapsulation layer TFEL includes at least one inorganic film and at least one organic film for encapsulating the light emitting element layer.

The touch sensing part TDU may be disposed on the encapsulation layer TFEL. The touch sensing part TDU may be disposed in the display area DA and the non-display area NDA of the main area MA. The touch sensing part TDU may sense a touch by a person or an object using touch electrodes.

A cover window for protecting an upper portion of the display panel 100 may be disposed on the touch sensing part TDU. The cover window may be attached onto the touch sensing part TDU by a transparent adhesive member such as an optically clear adhesive (OCA) film or an optically clear resin (OCR). The cover window may be made of an inorganic material such as glass or be made of an organic material such as plastic or a polymer material.

In addition, an anti-reflection member may be additionally disposed between the touch sensing part TDU and the cover window in order to prevent a decrease in visibility of an image displayed by the display panel 100 due to reflection of external light from the display panel 100. The anti-reflection member may be a polarizing film or a color filter.

A touch driving circuit 400 may be disposed on the circuit board 300. The touch driving circuit 400 may be formed as an integrated circuit (IC) and attached to the circuit board 300.

The touch driving circuit 400 may be electrically connected to a plurality of driving electrodes and a plurality of sensing electrodes of the touch sensing part TDU. The touch driving circuit 400 applies touch driving signals to the plurality of driving electrodes, and senses a touch sensing signal, for example, a charge change amount of a mutual capacitance, of each of a plurality of touch nodes through the plurality of sensing electrodes. The touch driving circuit 400 may determine whether or not a user has performed a touch, whether or not the user has approached the display device, and the like, according to the touch sensing signal of each of the plurality of touch nodes. The touch of the user indicates that a user's finger or an object such as a pen comes into direct contact with a front surface of the display device 10 disposed on the touch sensing part TDU. The approach of the user indicates that the user's finger or the object such as the pen is positioned apart from the front surface of the display device 10, such as hovering.

Figure 5:
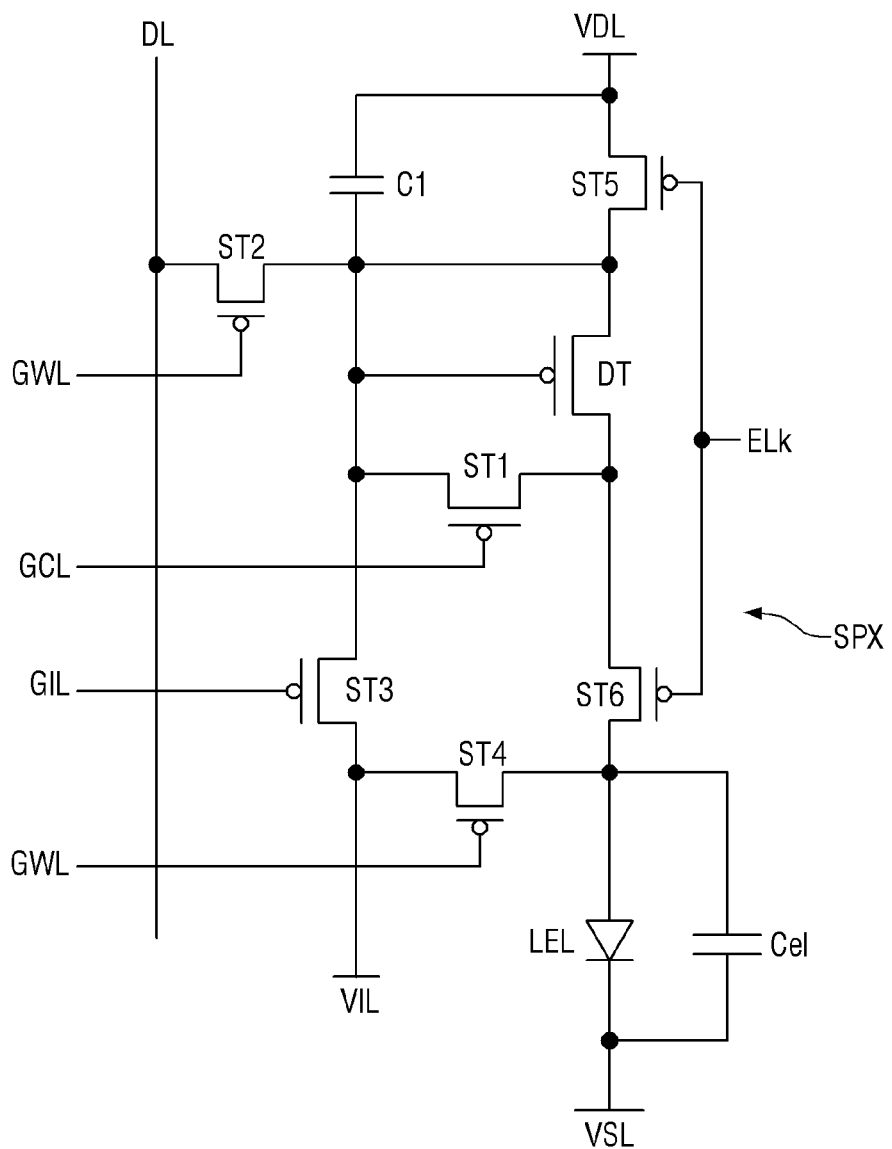
FIG. 5 is a circuit diagram illustrating a sub-pixel of a display layer according to an exemplary embodiment.

FIG. 5 is a circuit diagram illustrating a sub-pixel of a display layer according to an exemplary embodiment.

Referring to FIG. 5, a sub-pixel SPX may be connected to any two of scan lines SL, any one of light emitting lines ELk, and any one of data lines. For example, the sub-pixel SPX may be connected to a write scan line GWL, an initialization scan line GIL, a control scan line GCL, a light emitting line ELk, and a data line DL.

The sub-pixel SPX includes a driving transistor DT, a light emitting element LEL, switch elements, and a capacitor C1. The switch elements include first to sixth transistors ST1, ST2, ST3, ST4, ST5, and ST6.

The driving transistor DT includes a gate electrode, a first electrode, and a second electrode. The driving transistor DT controls a drain-source current Ids (hereinafter, referred to as a "driving current") flowing between the first electrode and the second electrode according to a data voltage applied to the gate electrode.

The light emitting element LEL emits light according to the driving current Ids. An amount of light emitted from the light emitting element LEL may be proportional to the driving current Ids.

The light emitting element LEL may be an organic light emitting diode including an anode electrode, a cathode electrode, and an organic light emitting layer disposed between the anode electrode and the cathode electrode. Alternatively, the light emitting element LEL may be an inorganic light emitting element including an anode electrode, a cathode electrode, and an inorganic semiconductor disposed between the anode electrode and the cathode electrode. Alternatively, the light emitting element LEL may be a quantum dot light emitting element including an anode electrode, a cathode electrode, and a quantum dot light emitting layer disposed between the anode electrode and the cathode electrode. Alternatively, the light emitting element LEL may be a micro light emitting diode.

The anode electrode of the light emitting element LEL may be connected to the first electrode of the fourth transistor ST4 and the second electrode of the sixth transistor ST6, and the cathode electrode of the light emitting element LEL may be connected to a first power supply line VSL. A parasitic capacitance Ce1 may be formed between the anode electrode and the cathode electrode of the light emitting element LEL.

The capacitor C1 is formed between the second electrode of the driving transistor DT and a second power supply line VDL. One electrode of the capacitor C1 may be connected to the second electrode of the driving transistor DT, and the other electrode of the capacitor C1 may be connected to the second power supply line VDL.

As illustrated in FIG. 5, all of the first to sixth transistors ST1, ST2, ST3, ST4, ST5, and ST6, and the driving transistor DT may be formed as P-channel metal oxide semiconductor field effect transistors (MOSFETs). An active layer of each of the first to sixth transistors ST1, ST2, ST3, ST4, ST5, and ST6 and the driving transistor DT may be formed of polysilicon or an oxide semiconductor.

A gate electrode of the second transistor ST2 and a gate electrode of the fourth transistor ST4 may be connected to the write scan line GWL, and a gate electrode of the first transistor ST1 may be connected to the control scan line GCL. A gate electrode of the third transistor ST3 may be connected to the initialization scan line GIL. The first to sixth transistors ST1, ST2, ST3, ST4, ST5, and ST6 are formed as the P-channel MOSFETs, and may thus be turned on when a scan signal and a light emitting signal of a gate low voltage are applied to the control scan line GCL, the initialization scan line GIL, the write scan line GWL, and the light emission line ELk, respectively.

Figure 6:
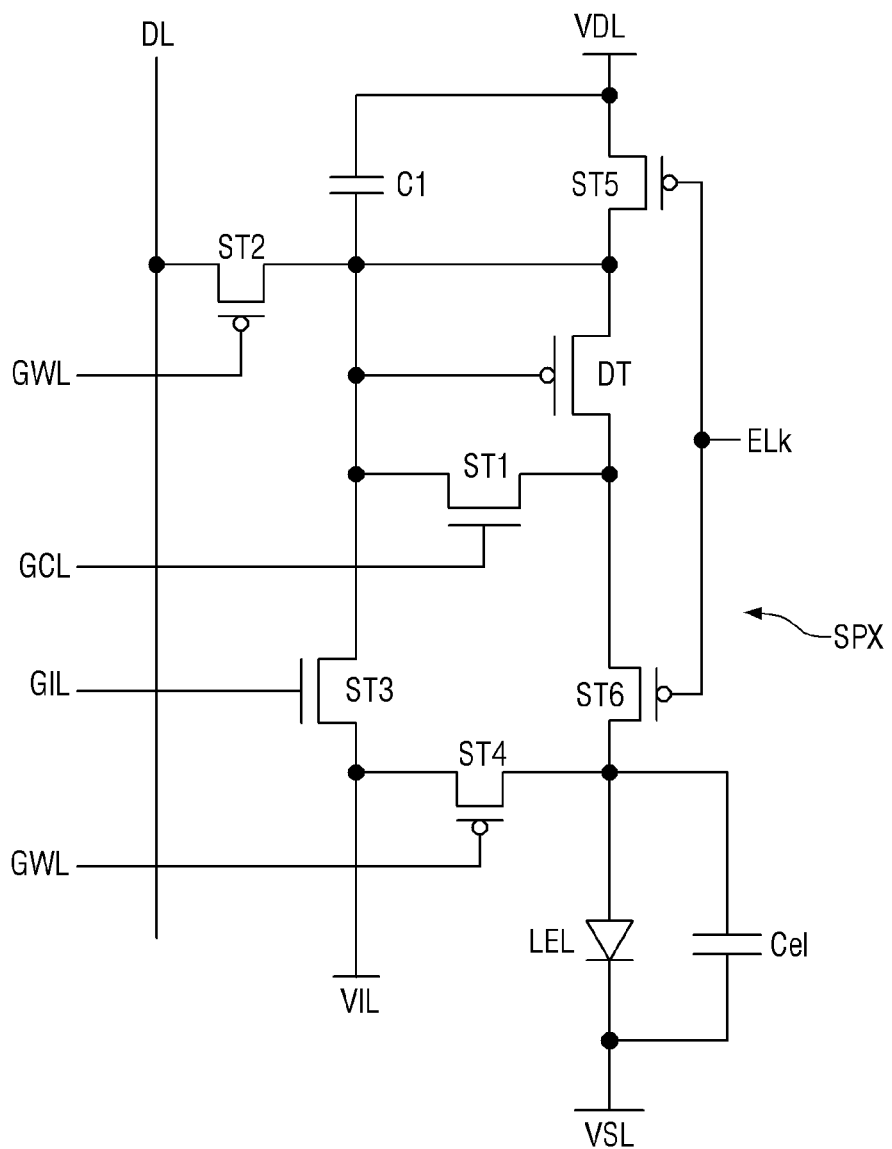
FIG. 6 is a circuit diagram illustrating a sub-pixel of a display layer according to another exemplary embodiment.

Alternatively, as illustrated in FIG. 6, the driving transistor DT, the second transistor ST2, the fourth transistor ST4, the fifth transistor ST5, and the sixth transistor ST6 may be formed as P-channel MOSFETs, and the first transistor ST1 and the third transistor ST3 may be formed as N-channel MOSFETs. An active layer of each of the driving transistor DT, the second transistor ST2, the fourth transistor ST4, the fifth transistor ST5, and the sixth transistor ST6 formed as the P-channel MOSFETs may be formed of polysilicon, and an active layer of each of the first The transistor ST1 and the third transistor ST3 formed as the N-channel MOSFETs may be formed of an oxide semiconductor. In this case, the transistors formed of the polysilicon and the transistors formed of the oxide semiconductor may be disposed on different layers, and thus, an arrangement area of the transistors in each of the pixels PX may be reduced.

A gate electrode of the second transistor ST2 and a gate electrode of the fourth transistor ST4 may be connected to the write scan line GWL, and a gate electrode of the first transistor ST1 may be connected to the control scan line GCL. A gate electrode of the third transistor ST3 may be connected to the initialization scan line GIL. The first transistor ST1 and the third transistor ST3 are formed as the N-channel MOSFETs, and may thus be turned on when a scan signal of a gate high voltage is applied to the control scan line GCL and the initialization scan line GIL. On the other hand, the second transistor ST2, the fourth transistor ST4, the fifth transistor ST5, and the sixth transistor ST6 are formed as the P-channel MOSFETs, and may thus be turned on when a scan signal and a light emitting signal of a gate low voltage are applied to the write scan line GWL and the light emitting line ELk, respectively.

Figure 7:
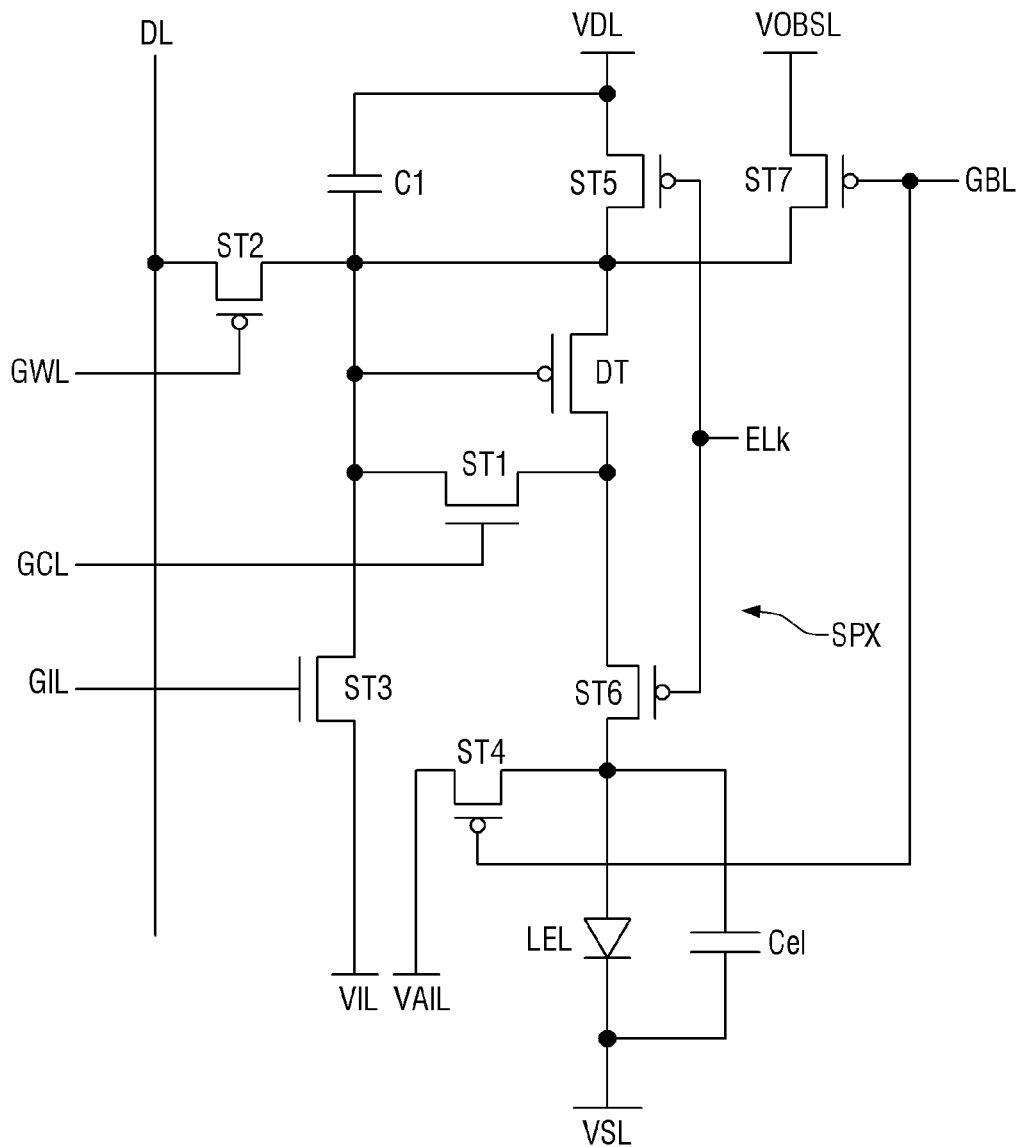
FIG. 7 is a circuit diagram illustrating a sub-pixel of a display layer according to still another exemplary embodiment.

Alternatively, as illustrated in FIG. 7, the pixel PX may further include a seventh transistor ST7. An active layer of the seventh transistor ST7 may be formed of polysilicon. A gate electrode of the fourth transistor ST4 and a gate electrode of the seventh transistor ST7 may be connected to a bias scan line GBL. The fourth transistor ST4 and the seventh transistor ST7 are formed as P-channel MOSFETs, and may thus be turned on when a scan signal of a gate low voltage is applied to the bias scan line GBL.

Figure 8:
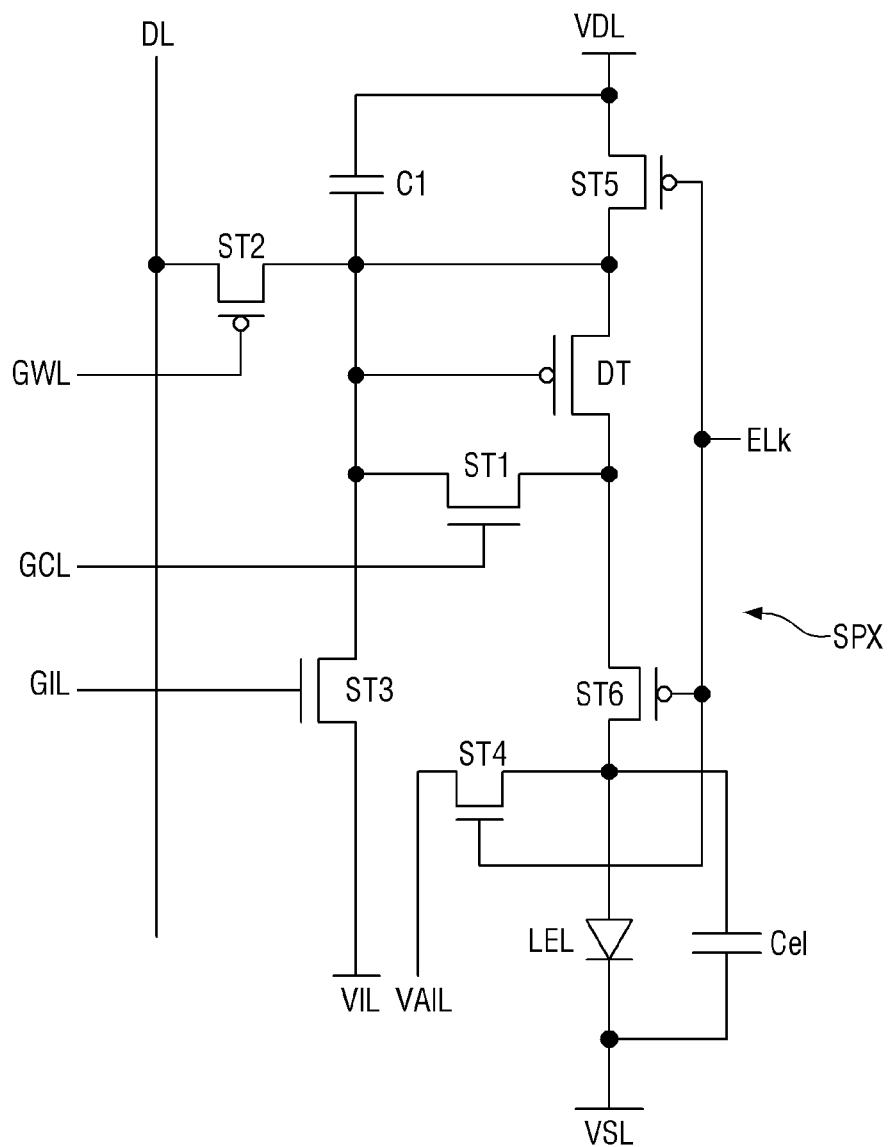
FIG. 8 is a circuit diagram illustrating a sub-pixel of a display layer according to still another exemplary embodiment.

Alternatively, as illustrated in FIG. 8, an active layer of the fourth transistor ST4 may be formed of an oxide semiconductor. A gate electrode of the fourth transistor ST4, a gate electrode of the fifth transistor ST5, and a gate electrode of the sixth transistor ST6 may be connected to the light emitting line ELk. The fourth transistor ST4 is formed as an N-channel MOSFET, and may thus be turned on when a light emitting signal of a gate high voltage is applied to the light emitting line ELk.

Alternatively, although not illustrated in FIGS. 5 to 8, all of the first to sixth transistors ST1, ST2, ST3, ST4, ST5, and ST6, and the driving transistor DT may be formed as N-channel MOSFETs.

Figure 9:
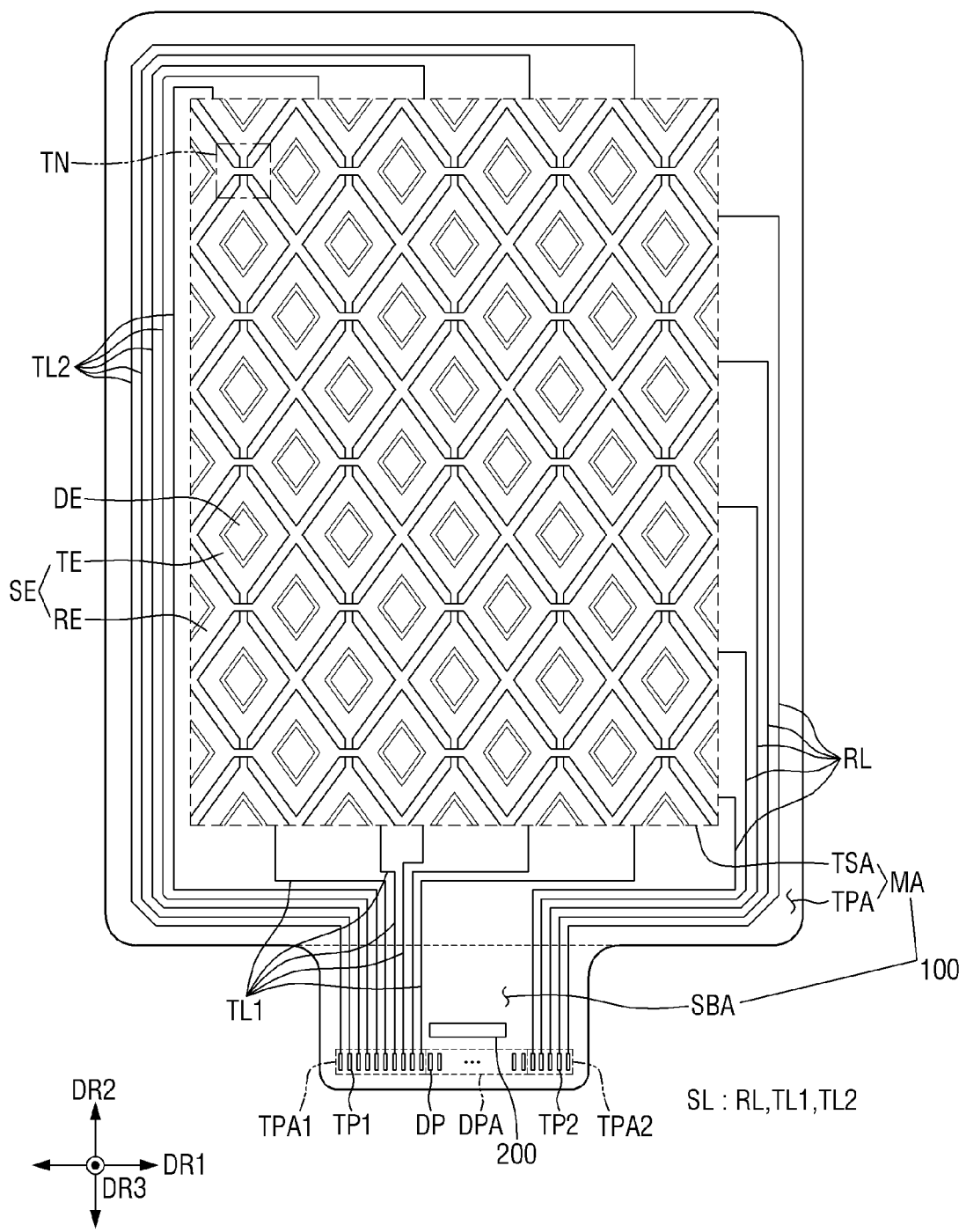
FIG. 9 is a layout diagram illustrating a touch sensing part according to an exemplary embodiment.

FIG. 9 is a layout diagram illustrating a touch sensing part according to an exemplary embodiment.

It has been mainly described in FIG. 9 that touch electrodes SE of the touch sensing part TDU include two types of electrodes, for example, driving electrodes TE and sensing electrodes RE, and are driven in a mutual capacitive manner of sensing a charge change amount of a mutual capacitance of each of a plurality of touch nodes TN through the sensing electrodes RE after applying touch driving signals to the driving electrodes TE, but the present disclosure is not limited thereto.

In FIG. 9, for convenience of explanation, only the driving electrodes TE, the sensing electrodes RE, dummy patterns DE, touch lines SL, display pads DP, and touch pads TP1 and TP2 have been illustrated.

Referring to FIG. 9, the touch sensing part TDU includes a touch sensing area TSA for sensing a touch by the user and a touch peripheral area TPA disposed around the touch sensing area TSA. The touch sensing area TSA may be substantially the same as the display area DA illustrated in FIGS. 1 to 4, and the touch peripheral area TPA may be substantially the same as the non-display area NDA illustrated in FIGS. 1 to 4.

The touch sensing area TSA includes the driving electrodes TE, the sensing electrodes RE, and the dummy patterns DE. The driving electrodes TE and the sensing electrodes RE may be electrodes for forming mutual capacitances in order to sense a touch by an object or a person.

The sensing electrodes RE may be arranged in the first direction DR1 and the second direction DR2. The sensing electrodes RE may be electrically connected to each other in the first direction DR1. That is, the sensing electrodes RE adjacent to each other in the first direction DR1 may be connected to each other. The sensing electrodes RE adjacent to each other in the second direction DR2 may be electrically disconnected from each other.

Figure 10:
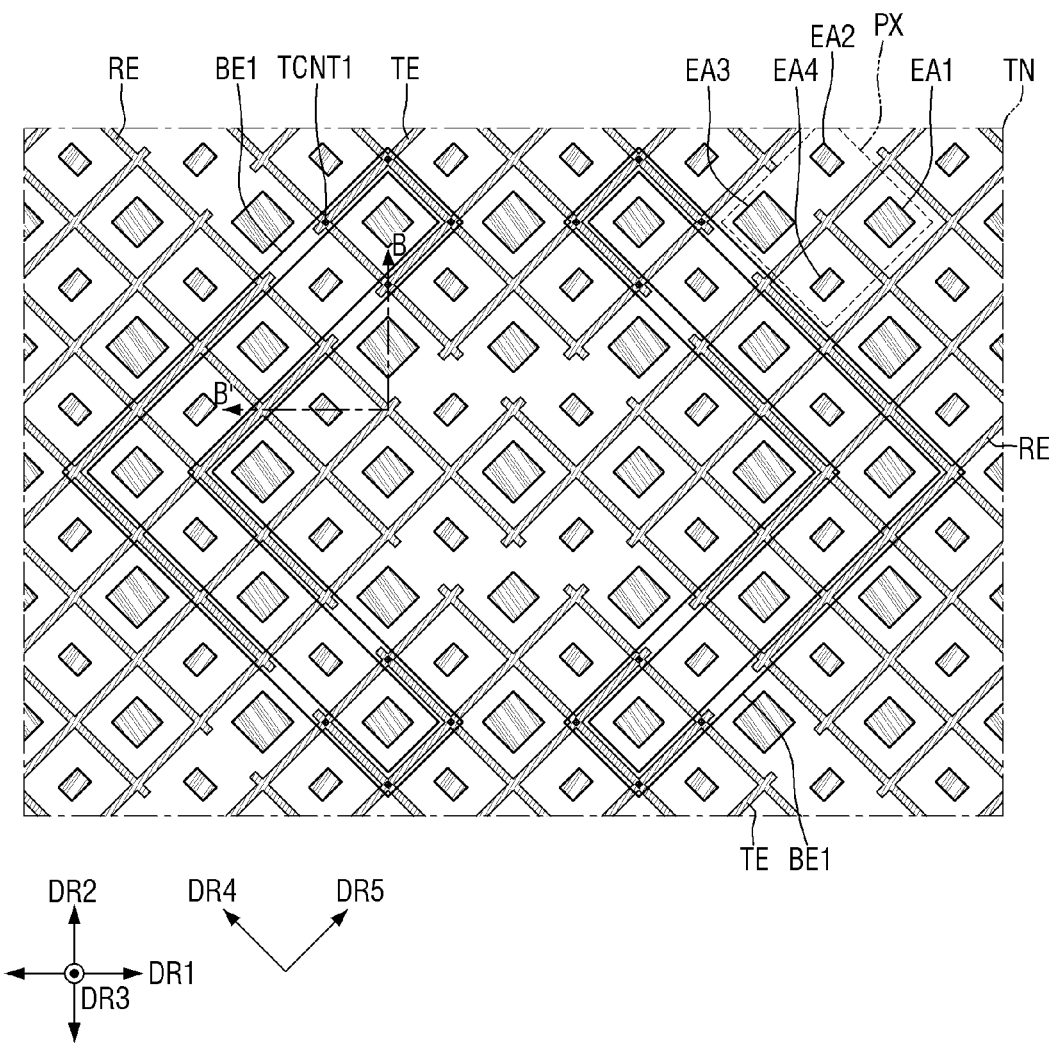
FIG. 10 is a layout diagram illustrating light emission areas and touch electrodes of a display panel of FIG. 9.

The driving electrodes TE may be arranged in the first direction DR1 and the second direction DR2. The driving electrodes TE may be electrically connected to each other in the second direction DR2. That is, the driving electrodes TE adjacent to each other in the second direction DR2 may be connected to each other. For example, the driving electrodes TE adjacent to each other in the second direction DR2 may be connected to each other through a connection electrode BE1 as illustrated in FIG. 10. The driving electrodes TE adjacent to each other in the first direction DR1 may be electrically disconnected from each other.

The touch node TN in which a mutual capacitance is formed may be disposed at each of intersection parts between the driving electrodes TE and the sensing electrodes RE. The plurality of touch nodes TN may correspond to the intersection parts between the driving electrodes TE and the sensing electrodes RE.

Each of the dummy patterns DE may be surrounded by the driving electrode TE or the sensing electrode RE. Each of the dummy patterns DE may be electrically disconnected from the driving electrode TE or the sensing electrode RE. Each of the dummy patterns DE may be disposed apart from the driving electrode TE or the sensing electrode RE. Each of the dummy patterns DE may be electrically floated.

It has been illustrated in FIG. 9 that each of the driving electrodes TE, the sensing electrodes RE, and the dummy patterns DE has a rhombic shape in plan view, but the present disclosure is not limited thereto. For example, each of the driving electrodes TE, the sensing electrodes RE, and the dummy patterns DE may have a rectangular shape other than the rhombic shape, a polygonal shape other than the rectangular shape, a circular shape, or an elliptical shape in plan view.

The touch lines SL may be disposed in the touch peripheral area TPA. The touch lines SL may include touch sensing lines RL connected to the sensing electrodes RE and first touch driving lines TL1 and second touch driving line TL2 connected to the driving electrodes TE.

The sensing electrodes RE disposed at one side of the touch sensing area TSA may be connected to the touch sensing lines RL in a one-to-one manner. For example, as illustrated in FIG. 9, the sensing electrodes RE disposed at a right end among the sensing electrodes RE electrically connected to each other in the first direction DR1 may be connected to the touch sensing lines RL. The touch sensing lines RL may be connected to second touch pads TP2 in a one-to-one manner. Therefore, the touch driving circuit 400 may be electrically connected to the sensing electrodes RE.

The driving electrodes TE disposed at one side of the touch sensing area TSA may be connected to the first touch driving lines TL1 in a one-to-one manner, and the driving electrodes TE disposed at the other side of the touch sensing area TSA may be connected to the second touch driving lines TL2 in a one-to-one manner. For example, as illustrated in FIG. 9, the driving electrodes TE disposed at a lower end among the driving electrodes TE electrically connected to each other in the second direction DR2 may be connected to the first touch driving lines TL1, and the driving electrodes TE disposed at an upper end among the driving electrodes TE electrically connected to each other in the second direction DR2 may be connected to the second touch driving lines TL2. The second touch driving lines TL2 may be connected to the driving electrodes TE above the touch sensing area TSA via a left outer side of the touch sensing area TSA.

The first touch driving lines TL1 and the second touch driving lines TL2 may be connected to first touch pads TP1 in a one-to-one manner. Therefore, the touch driving circuit 400 may be electrically connected to the driving electrodes TE. Since the driving electrodes TE are connected to the touch driving lines TL1 and TL2 at both sides of the touch sensing area TSA to receive the touch driving signals, the occurrence of a difference between the touch driving signal applied to the driving electrodes TE disposed at a lower side of the touch sensing area TSA and the touch driving signal applied to the driving electrodes TE disposed at an upper side of the touch sensing area TSA due to an RC delay of the touch driving signals may be prevented.

A first touch pad area TPA1 in which the first touch pads TP1 are disposed may be disposed at one side of a display pad area DPA in which the display pads DP are disposed. A second touch pad area TPA2 in which the second touch pads TP2 are disposed may be disposed at the other side of the display pad area DPA. The display pads DP may be electrically connected to data lines of the display panel 100.

The display pad area DPA, the first touch pad area TPA1, and the second touch pad area TPA2 may correspond to the pads PD of the display panel 100 connected to the circuit board 300 illustrated in FIG. 1. The circuit board 300 may be disposed on the display pads DP, the first touch pads TP1, and the second touch pads TP2. The display pads DP, the first touch pads TP1, and the second touch pads TP2 may be electrically connected to the circuit board 300 using a conductive adhesive member such as an anisotropic conductive film. Therefore, the display pads DP, the first touch pads TP1, and the second touch pads TP2 may be electrically connected to the touch driving circuit 400 disposed on the circuit board 300.

FIG. 10 is a layout diagram illustrating light emission areas and touch electrodes of a display panel of FIG. 9. In FIG. 10, an example of the touch node TN of FIG. 9 is illustrated.

Referring to FIG. 10, the touch node TN may be defined as an intersection part between the driving electrodes TE and the sensing electrodes RE.

The driving electrodes TE and the sensing electrodes RE are disposed on the same layer, and may thus be disposed apart from each other. That is, a gap may be formed between the driving electrode TE and the sensing electrode RE adjacent to each other.

In addition, the dummy patterns DE may be disposed on the same layer as the driving electrodes TE and the sensing electrodes RE. That is, a gap may be formed between the driving electrode TE and the dummy pattern DE adjacent to each other and between the sensing electrode RE and the dummy pattern DE adjacent to each other.

The connection electrodes BE1 may be disposed on a different layer from the driving electrodes TE and the sensing electrodes RE. The connection electrode BE1 may be formed to be bent at least once. It has been illustrated in FIG. 10 that the connection electrode BE1 has a clamp shape ("<" or ">"), but a shape of the connection electrode BE1 in plan view is not limited thereto. Since the driving electrodes TE adjacent to each other in the second direction DR2 are connected to each other by a plurality of connection electrodes BE1, even though any one of the connection electrodes BE1 is disconnected, the driving electrodes TE adjacent to each other in the second direction DR2 may be stably connected to each other. It has been illustrated in FIG. 10 that the driving electrodes TE adjacent to each other are connected to each other by two connection electrodes BE1, but the number of connection electrodes BE1 is not limited thereto.

The connection electrode BE1 may overlap the driving electrodes TE adjacent each other in the second direction DR2, in the third direction DR3 which is the thickness direction of the substrate SUB. The connection electrode BE1 may overlap the sensing electrode RE in the third direction DR3. One side of the connection electrode BE1 may be connected to any one of the driving electrodes TE adjacent to each other in the second direction DR2 through a touch contact hole TCNT1. The other side of the connection electrode BE1 may be connected to the other of the driving electrodes TE adjacent to each other in the second direction DR2 through a touch contact hole TCNT1.

Due to the connection electrodes BE1, the driving electrodes TE and the sensing electrodes RE may be electrically disconnected from each other at the intersection parts between the driving electrodes TE and the sensing electrodes RE. Therefore, mutual capacitances may be formed between the driving electrodes TE and the sensing electrodes RE.

Each of the driving electrodes TE, the sensing electrodes RE, and the connection electrodes BE1 may have a mesh shape or a net shape in plan view. In addition, each of the dummy patterns DE may have a mesh shape or a net shape in plan view. Therefore, each of the driving electrodes TE, the sensing electrodes RE, the connection electrodes BE1, and the dummy patterns DE may not overlap the respective light emitting parts EA1, EA2, EA3, and EA4 of the pixels PX. Therefore, it is possible to prevent the light emitted from the light emitting parts EA1, EA2, EA3, and EA4 from being blocked by the driving electrodes TE, the sensing electrodes RE, the connection electrodes BE1, and the dummy patterns DE to prevent a decrease in luminance of the light.

Each of the pixels PX may include a first light emitting part EA1 of a first sub-pixel emitting light of a first color, a second light emitting part EA2 of a second sub-pixel emitting light of a second color, a third light emitting part EA3 of a third sub-pixel emitting light of a third color, and a fourth light emitting part EA4 of a fourth sub-pixel emitting the light of the second color. For example, the first color may be red, the second color may be green, and the third color may be blue.

The first light emitting part EA1 and the second light emitting part EA2 of each of the pixels PX may neighbor to each other in a fourth direction DR4, and the third light emitting part EA3 and the fourth light emitting part EA4 of each of the pixels PX may neighbor to each other in the fourth direction DR4. The first light emitting part EA1 and the fourth light emitting part EA4 of each of the pixels PX may neighbor to each other in a fifth direction DR5, and the second light emitting part EA2 and the third light emitting part EA3 of each of the pixels PX may neighbor to each other in the fifth direction DR5.

Each of the first light emitting part EA1, the second light emitting part EA2, the third light emitting part EA3, and the fourth light emitting part EA4 may have a rhombic shape or a rectangular shape in plan view, but is limited thereto. Each of the first light emitting part EA1, the second light emitting part EA2, the third light emitting part EA3, and the fourth light emitting part EA4 may have a polygonal shape other than the rectangular shape, a circular shape, or an elliptical shape in plan view. In addition, it has been illustrated in FIG. 10 that the third light emitting part EA3 has the largest area and the second light emitting part EA2 and the fourth light emitting part EA4 have the smallest area, but the present disclosure is not limited thereto.

The second light emitting parts EA2 and the fourth light emitting parts EA4 may be disposed in odd-numbered rows. The second light emitting parts EA2 and the fourth light emitting parts EA4 may be disposed side by side in the first direction DR1 in each of the odd-numbered rows. The second light emitting parts EA2 and the fourth light emitting parts EA4 may be alternately disposed in each of the odd-numbered rows. Each of the second light emitting parts EA2 may have long sides in the fourth direction DR4 and short sides in the fifth direction DR5, while each of the fourth light emitting parts EA4 may have short sides in the fourth direction DR4 and long sides in the fifth direction DR5. The fourth direction DR4 may be a direction between the first direction DR1 and the second direction DR2, and may be a direction inclined by 45° with respect to the first direction DR1. The fifth direction DR5 may be a direction perpendicular to the fourth direction DR4.

The first light emitting parts EA1 and the third light emitting parts EA3 may be disposed in even-numbered rows. The first light emitting parts EA1 and the third light emitting parts EA3 may be disposed side by side in the first direction DR1 in each of the even-numbered rows. The first light emitting parts EA1 and the third light emitting parts EA3 may be alternately disposed in the even-numbered rows.

The second light emitting parts EA2 and the fourth light emitting parts EA4 may be disposed in odd-numbered columns. The second light emitting parts EA2 and the fourth light emitting parts EA4 may be disposed side by side in the second direction DR2 in each of the odd-numbered columns. The second light emitting parts EA2 and the fourth light emitting parts EA4 may be alternately disposed in each of the odd-numbered columns.

The first light emitting parts EA1 and the third light emitting parts EA3 may be disposed in even-numbered columns. The first light emitting parts EA1 and the third light emitting parts EA3 may be disposed side by side in the second direction DR2 in each of the even-numbered columns. The first light emitting parts EA1 and the third light emitting parts EA3 may be alternately disposed in the even-numbered columns.

Figure 11:
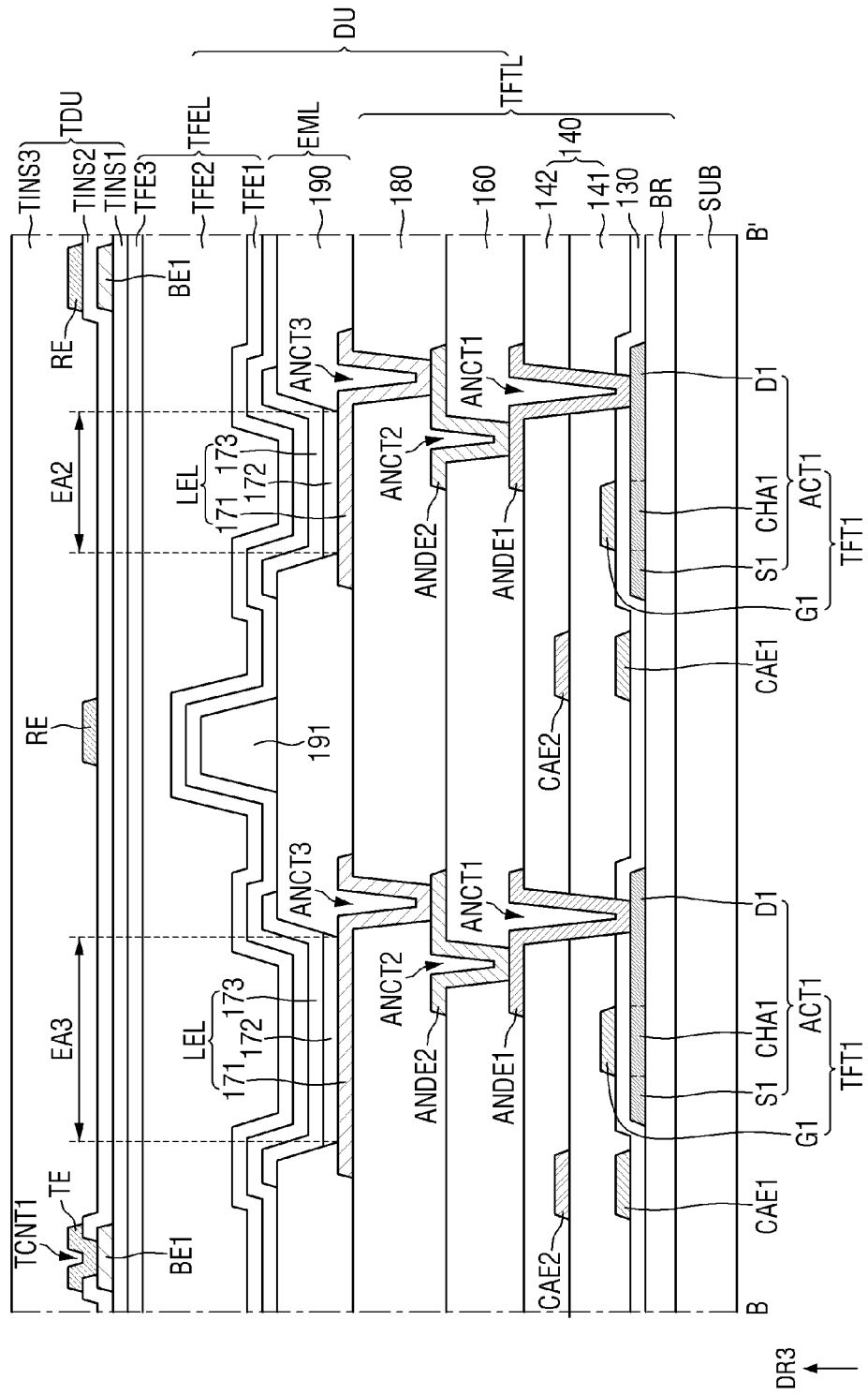
FIG. 11 is a cross-sectional view illustrating an example of the display panel taken along line B-B' of FIG. 10.

FIG. 11 is a cross-sectional view illustrating an example of the display panel taken along line B-B' of FIG. 10.

Referring to FIG. 11, a barrier film BR may be disposed on the substrate SUB. The substrate SUB may be made of an insulating material such as a polymer resin. For example, the substrate SUB may be made of polyimide. The substrate SUB may be a flexible substrate that may be bent, folded, and rolled.

The barrier film BR is a film for protecting transistors of a thin film transistor layer TFTL and light emitting layers 172 of a light emitting element layer EML from moisture permeating through the substrate SUB vulnerable to moisture permeation. The barrier film BR may include a plurality of inorganic films that are alternately stacked. For example, the barrier film BR may be formed as multiple films in which one or more inorganic films of a silicon nitride layer, a silicon oxynitride layer, a silicon oxide layer, a titanium oxide layer, and an aluminum oxide layer are alternately stacked.

First thin film transistors TFT1 may be disposed on the barrier film BR. The first thin film transistor TFT1 may be any one of the fourth transistor ST4 and the sixth transistor ST6 illustrated in FIGS. 5 to 7. Alternatively, the first thin film transistor TFT1 may be the sixth thin film transistor ST6 illustrated in FIG. 8. The first thin film transistor TFT1 may include a first active layer ACT1 and a first gate electrode G1.

The first active layer ACT1 of the first thin film transistor TFT1 may be disposed on the barrier film BR. The first active layer ACT1 of the first thin film transistor TFT1 may include polycrystalline silicon, single crystal silicon, low-temperature polycrystalline silicon, amorphous silicon, or an oxide semiconductor.

The first active layer ACT1 may include a first channel region CHA1, a first source region S1, and a first drain region D1. The first channel region CHA1 may be a region overlapping the first gate electrode G1 in the third direction DR3 which is the thickness direction of the substrate SUB. The first source region S1 may be disposed on one side of the first channel region CHA1, and the first drain region D1 may be disposed on the other side of the first channel region CHA1. The first source region S1 and the first drain region D1 may be regions that do not overlap the first gate electrode G1 in the third direction DR3. The first source region S1 and the first drain region D1 may be regions having conductivity by doping a silicon semiconductor or an oxide semiconductor with ions or impurities.

A first gate insulating film 130 may be disposed on the first active layer ACT1 of the first thin film transistor TFT1. The first gate insulating film 130 may be formed as an inorganic film, for example, a silicon nitride layer, a silicon oxynitride layer, a silicon oxide layer, a titanium oxide layer, or an aluminum oxide layer.

The first gate electrode G1 and a first capacitor electrode CAE1 of the first thin film transistor TFT1 may be disposed on the first gate insulating film 130. The first gate electrode G1 may overlap the first active layer ACT1 in the third direction DR3. It has been illustrated in FIG. 11 that the first gate electrode G1 and the first capacitor electrode CAE1 are disposed apart from each other in FIG. 11, but the first gate electrode G1 and the first capacitor electrode CAE1 may be connected to each other. Each of the first gate electrode G1 and the first capacitor electrode CAE1 may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

A first interlayer insulating film 141 may be disposed on the first gate electrode G1 and the first capacitor electrode CAE1 of the first thin film transistor TFT1. The first interlayer insulating film 141 may be formed as an inorganic film, for example, a silicon nitride layer, a silicon oxynitride layer, a silicon oxide layer, a titanium oxide layer, or an aluminum oxide layer. The first interlayer insulating film 141 may be formed as a plurality of inorganic films.

A second capacitor electrode CAE2 may be disposed on the first interlayer insulating film 141. The second capacitor electrode CAE2 may overlap the first capacitor electrode CAE1 of the first thin film transistor TFT1 in the third direction DR3. When the first capacitor electrode CAE1 is connected to the first gate electrode G1, the second capacitor electrode CAE2 may overlap the first gate electrode G1 in the third direction DR3. Since the first interlayer insulating film 141 has a predetermined dielectric constant, a capacitor may be formed by the first capacitor electrode CAE1, the second capacitor electrode CAE2, and the first interlayer insulating film 141 disposed between the first capacitor electrode CAE1 and the second capacitor electrode CAE2. The second capacitor electrode CAE2 may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

A second interlayer insulating film 142 may be disposed on the second capacitor electrode CAE2. The second interlayer insulating film 142 may be formed as an inorganic film, for example, a silicon nitride layer, a silicon oxynitride layer, a silicon oxide layer, a titanium oxide layer, or an aluminum oxide layer. The second interlayer insulating film 142 may be formed as a plurality of inorganic films.

A first anode connection electrode ANDE1 may be disposed on the second interlayer insulating film 142. The first anode connection electrode ANDE1 may be connected to the first drain region D1 of the first thin film transistor TFT1 through a first connection contact hole ANCT1 penetrating through the first gate insulating film 130, the first interlayer insulating film 141, and the second interlayer insulating film 142. The first anode connection electrode ANDE1 may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

A first planarization film 160 for planarizing a step due to the first thin film transistor TFT1 may be disposed on the first anode connection electrode ANDE1. The first planarization film 160 may be formed as an organic film made of an acryl resin, an epoxy resin, a phenolic resin, a polyamide resin, a polyimide resin, or the like.

A second anode connection electrode ANDE2 may be disposed on the first planarization film 160. The second anode connection electrode ANDE2 may be connected to the first anode connection electrode ANDE1 through a second connection contact hole ANCT2 penetrating through the first planarization film 160. The second anode connection electrode ANDE2 may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

A second planarization film 180 may be disposed on the second anode connection electrode ANDE2. The second planarization film 180 may be formed as an organic film made of an acryl resin, an epoxy resin, a phenolic resin, a polyamide resin, a polyimide resin, or the like.

Light emitting elements LEL and a bank 190 may be disposed on the second planarization film 180. Each of the light emitting elements LEL includes a pixel electrode 171, a light emitting layer 172, and a common electrode 173.

The pixel electrode 171 may be disposed on the second planarization film 180. The pixel electrode 171 may be connected to the second anode connection electrode ANDE2 through a third connection contact hole ANCT3 penetrating through the second planarization film 180.

In a top emission structure in which light is emitted toward the common electrode 173 based on the light emitting layer 172, the pixel electrode 171 may be formed of a metal material having high reflectivity, such as a stacked structure (Ti/Al/Ti) of aluminum and titanium, a stacked structure (ITO/Al/ITO) of aluminum and indium tin oxide (ITO), an APC alloy, and a stacked structure (ITO/APC/ITO) of an APC alloy and ITO. The APC alloy is an alloy of silver (Ag), palladium (Pd), and copper (Cu).

The bank 190 may be formed to partition the pixel electrodes 171 on the second planarization film 180, in order to define the first light emitting part EA1, the second light emitting part EA2, the third light emitting part EA3, and the fourth light emitting part EA4. The bank 190 may be disposed to cover an edge of the pixel electrode 171. The bank 190 may be formed as an organic film made of an acryl resin, an epoxy resin, a phenolic resin, a polyamide resin, a polyimide resin, or the like.

Each of the first light emitting part EA1, the second light emitting part EA2, the third light emitting part EA3, and the fourth light emitting part EA4 refers to an area in which the pixel electrode 171, the light emitting layer 172, and the common electrode 173 are sequentially stacked and holes from the pixel electrode 171 and electrons from the common electrode 173 are recombined with each other in the emission layer 172 to emit light.

The light emitting layer 172 may be disposed on the pixel electrode 171 and the bank 190. The light emitting layer 172 may include an organic material to emit light of a predetermined color. For example, the light emitting layer 172 includes a hole transporting layer, an organic material layer, and an electron transporting layer.

The common electrode 173 may be disposed on the light emitting layer 172. The common electrode 173 may be disposed to cover the light emitting layer 172. The common electrode 173 may be a common layer commonly formed in the first light emitting part EA1, the second light emitting part EA12, the third light emitting part EA3, and the fourth light emitting part EA4. A capping layer may be formed on the common electrode 173.

In the top emission structure, the common electrode 173 may be formed of a transparent conductive material (TCO) such as ITO or indium zinc oxide (IZO) capable of transmitting light therethrough or a semi-transmissive conductive material such as magnesium (Mg), silver (Ag), or an alloy of magnesium (Mg) and silver (Ag). When the common electrode 173 is formed of the semi-transmissive conductive material, emission efficiency may be increased by a micro cavity.

A spacer 191 may be disposed on the bank 190. The spacer 191 may serve to support a mask during a manufacturing process of manufacturing the light emitting layer 172. The spacer 191 may be formed as an organic film made of an acryl resin, an epoxy resin, a phenolic resin, a polyamide resin, a polyimide resin, or the like.

An encapsulation layer TFEL may be disposed on the common electrode 173. The encapsulation layer TFEL includes at least one inorganic film in order to prevent oxygen or moisture from permeating into the light emitting element layer EML. In addition, the encapsulation layer TFEL includes at least one organic film in order to protect the light emitting element layer EML from foreign materials such as dust. For example, the encapsulation layer TFEL includes a first encapsulation inorganic film TFE1, an encapsulation organic film TFE2, and a second encapsulation inorganic film TFE3.

The first encapsulation inorganic film TFE1 may be disposed on the common electrode 173, the encapsulation organic film TFE2 may be disposed on the first encapsulation inorganic film TFE1, and the second encapsulation inorganic film TFE3 may be disposed on the encapsulation organic film TFE2. The first encapsulation inorganic film TFE1 and the second encapsulation inorganic film TFE3 may be formed as multiple films in which one or more inorganic films of a silicon nitride layer, a silicon oxynitride layer, a silicon oxide layer, a titanium oxide layer, and an aluminum oxide layer are alternately stacked. The encapsulation organic film TFE2 may be an organic film made of an acryl resin, an epoxy resin, a phenolic resin, a polyamide resin, a polyimide resin, or the like.

A touch sensing part TDU may be disposed on the encapsulation layer TFEL. The touch sensing part TDU includes a first touch insulating film TINS1, the connection electrode BE1, a second touch insulating film TINS2, the driving electrode TE, the sensing electrode RE, and a third touch insulating film TINS3.

The first touch insulating film TINS1 may be formed as an inorganic film, for example, a silicon nitride layer, a silicon oxynitride layer, a silicon oxide layer, a titanium oxide layer, or an aluminum oxide layer.

The connection electrode BE1 may be disposed on the first touch insulating film TINS1. The connection electrode BE1 may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

The second touch insulating film TINS2 is disposed on the connection electrode BE1. The second touch insulating film TINS2 may be formed as an inorganic film, for example, a silicon nitride layer, a silicon oxynitride layer, a silicon oxide layer, a titanium oxide layer, or an aluminum oxide layer. Alternatively, the second touch insulating film TINS2 may be formed as an organic film made of an acryl resin, an epoxy resin, a phenolic resin, a polyamide resin, a polyimide resin, or the like.

The driving electrodes TE and the sensing electrodes RE may be disposed on the second touch insulating film TINS2. In addition, in addition to the driving electrodes TE and the sensing electrodes RE, the dummy patterns DE, the first touch driving lines TL1, the second touch driving lines TL2, and the touch sensing lines RL illustrated in FIG. 9 may be disposed on the second touch insulating film TINS2. Each of the driving electrodes TE and the sensing electrodes RE may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

The driving electrode TE and the sensing electrode RE may overlap the connection electrode BE1 in the third direction DR3. The driving electrode TE may be connected to the connection electrode BE1 through a touch contact hole TCNT1 penetrating through the first touch insulating film TINS1.

The third touch insulating film TINS3 is formed on the driving electrodes TE and the sensing electrodes RE. The third touch insulating film TINS3 may serve to planarize a step formed due to the driving electrodes TE, the sensing electrodes RE, and the connection electrodes BE1. Alternatively, the third touch insulating film TINS3 may be formed as an organic film made of an acryl resin, an epoxy resin, a phenolic resin, a polyamide resin, a polyimide resin, or the like.

Figure 12:
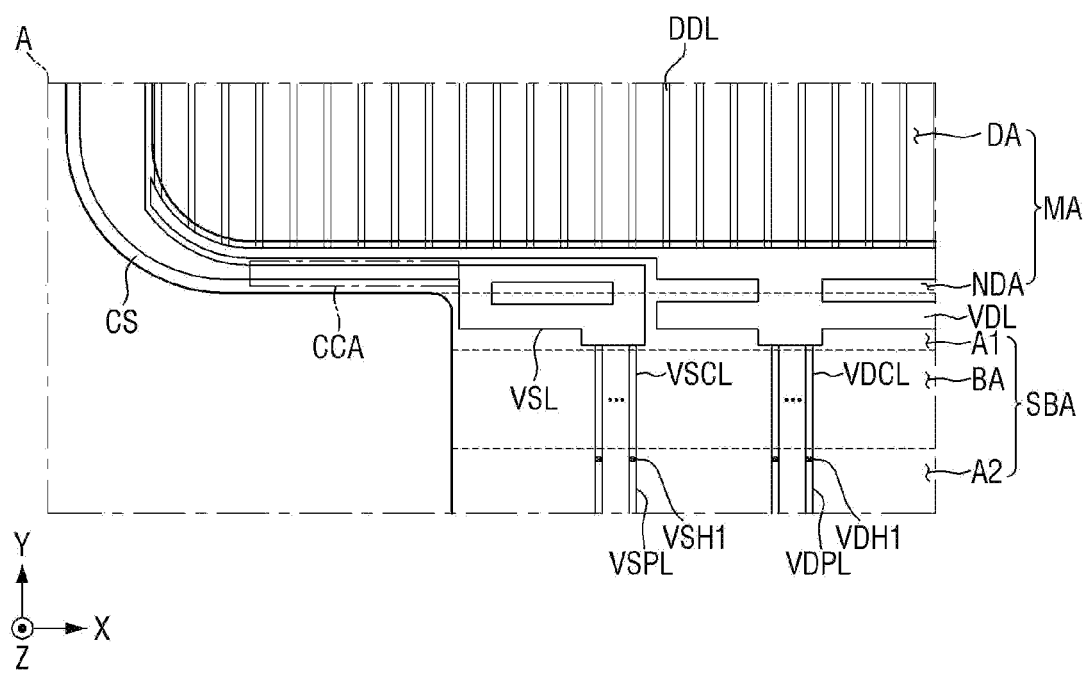
FIG. 12 is a layout diagram illustrating a non-display area of the display panel according to an exemplary embodiment.
Figure 13:
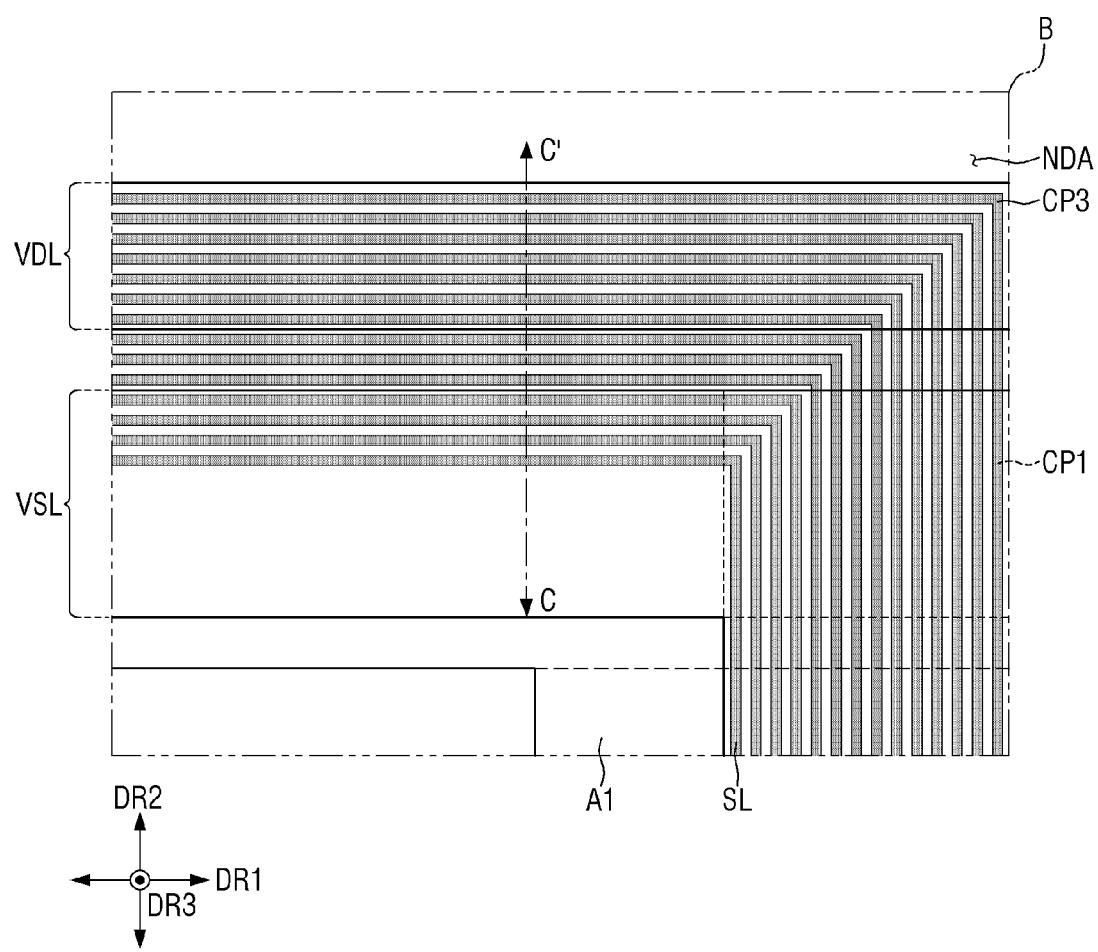
FIG. 13 is a layout diagram illustrating region B of FIG. 12 in detail.

FIG. 12 is a layout diagram illustrating a non-display area of the display panel according to an exemplary embodiment. FIG. 13 is a layout diagram illustrating region B of FIG. 12 in detail.

Referring to FIGS. 12 and 13, a first power supply line VSL, a second power supply line VDL, first power connection lines VSCL, second power connection lines VDCL, display power lines DDL, and touch lines SL are illustrated.

Referring to FIGS. 12 and 13, the first power supply line VSL may be disposed in the non-display area NDA and the first area A1. The first power supply line VSL may be disposed in the non-display area NDA disposed at a left side, a lower side, and a right side of the display panel 100. The first power supply line VSL may extend in the first direction DR1 in the non-display area NDA disposed at the lower side of the display panel 100. The first power supply line VSL may extend in the second direction DR2 in the first area A1. The first power supply line VSL may include a first bent part CP1 bent from the second direction DR2 to the first direction DR1 in the non-display area NDA disposed at the lower side of the display panel 100.

In addition, the first power supply line VSL may be disposed in the non-display area NDA at the lower side and the left side of the display panel 100, and a corner of the display panel 100 where the lower side and the left side meet. In addition, the first power supply line VSL may be disposed in the non-display area NDA at the lower side and the right side of the display panel 100, and a corner of the display panel 100 where the lower side and the right side meet. In addition, the first power supply line VSL may be disposed in the non-display area NDA at an upper side of the display panel 100, a corner of the display panel 100 where the upper side and the left side meet, and a corner of the display panel 100 where the upper side and the right side meet.

The second power supply line VDL may be disposed in the non-display area NDA and the first area A1. The second power supply line VDL may be disposed in the non-display area NDA disposed at the lower side of the display panel 100. The second power supply line VDL may extend in the first direction DR1 in the non-display area NDA disposed at the lower side of the display panel 100. The second power supply line VDL may extend in the second direction DR2 in the first area A1. The second power supply line VDL may include a second bent part CP2 bent from the second direction DR2 to the first direction DR1 in the non-display area NDA disposed at the lower side of the display panel 100.

The first power connection lines VSCL may be disposed in the bending area BA. Each of the first power connection lines VSCL may extend from the first power supply line VSL.

The second power connection lines VDCL may be disposed in the bending area BA. Each of the second power connection lines VDCL may be connected to the second power supply line VDL through the power connection hole.

The display power lines DDL may be disposed in the display area DA. The display power lines DDL may be connected to the second power supply line VDL in the non-display area NDA disposed at the lower side of the display panel 100.

The display power lines DDL may be disposed in a mesh shape (or a net shape) in the display area DA. Therefore, a second power supply voltage may be more uniformly applied to the sub-pixels SPX of the display area DA.

The touch lines SL may be disposed in the non-display area NDA and the first area A1. Each of the touch lines SL may extend in the first direction DR1 in the non-display area NDA disposed at the lower side of the display panel 100. Each of the touch lines SL may extend in the second direction DR2 in the first area A1. Each of the touch lines SL may include a third bent part CP3 bent from the second direction DR2 to the first direction DR1 in the non-display area NDA disposed at the lower side of the display panel 100. Each of the touch lines SL may overlap at least one of the first power supply line VSL and the second power supply line VDL in the non-display area NDA disposed at the lower side of the display panel 100.

Figure 14:
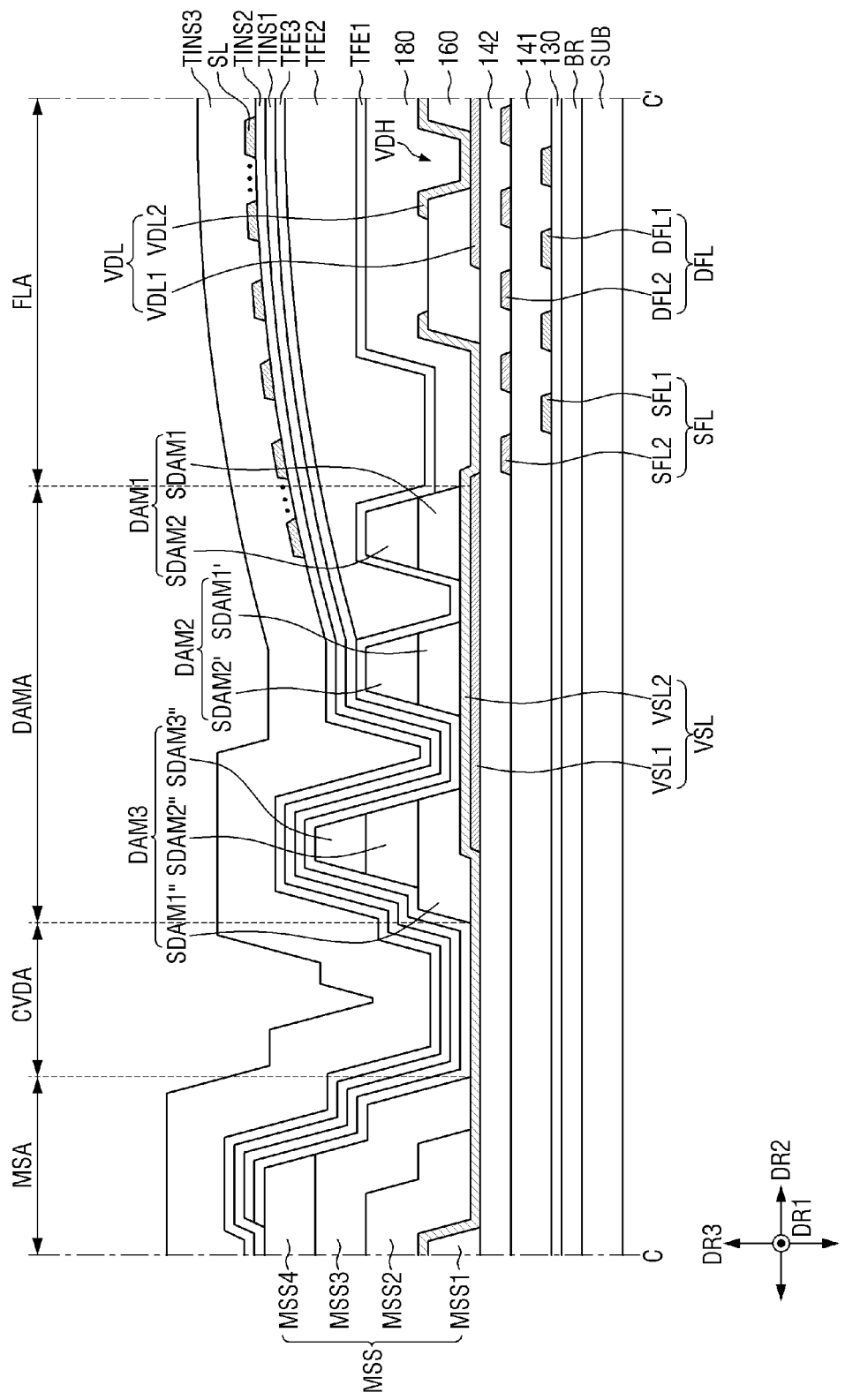
FIG. 14 is a cross-sectional view illustrating an example of the display panel taken along line C-C' of FIG. 13.

FIG. 14 is a cross-sectional view illustrating an example of the display panel taken along line C-C' of FIG. 13.

Referring to FIG. 14, a fan-out line area FLA may be disposed between the display area DA and a dam area DAMA. Data fan-out lines DFL and scan fan-out lines SFL may be disposed in the fan-out line area FLA.

The data fan-out lines DFL may include first data fan-out lines DFL1 disposed on the first gate insulating film 130 and second data fan-out lines DFL2 disposed on the first interlayer insulating film 141. In addition, the scan fan-out lines SFL may include first scan fan-out lines SFL1 disposed on the first gate insulating film 130 and second scan fan-out lines SFL2 disposed on the first interlayer insulating film 141.

The first data fan-out lines DFL1 and the first scan fan-out lines SFL1 may be disposed on the same layer as the first gate electrode G1 and the first capacitor electrode CAE1, and may include the same material as the first gate electrode G1 and the first capacitor electrode CAE1. In addition, the second data fan-out lines DFL2 and the second scan fan-out lines SFL2 may be disposed on the same layer as the second capacitor electrode CAE2, and may include the same material as the second capacitor electrode CAE2.

The first data fan-out lines DFL1 and the second data fan-out lines DFL2 may be alternately disposed in the second direction DR2. That is, the first data fan-out lines DFL1 and the second data fan-out lines DFL2 may be disposed in the order of the first data fan-out line DFL1, the second data fan-out line DFL2, the first data fan-out line DFL1, and the second data fan-out line DFL2 in the second direction DR2.

The first scan fan-out lines SFL1 and the second scan fan-out lines SFL2 may be alternately disposed in the second direction DR2. That is, the first scan fan-out lines SFL1 and the second scan fan-out lines SFL2 may be disposed in the order of the first scan fan-out line SFL1, the second scan fan-out line SFL2, the first scan fan-out line SFL1, and the second scan fan-out line SFL2 in the second direction DR2.

The dam area DAMA may be an area in which at least one dam DAM1, DAM2, or DAM3 is disposed. It has been mainly described in FIG. 14 that a first dam DAM1, a second dam DAM2, and a third dam DAM3 are disposed in the dam area DAMA, but the number of dams disposed in the dam area DAMA is not limited thereto.

The first dam DAM1, the second dam DAM2, and the third dam DAM3 may be disposed apart from each other. The first dam DAM1 may be disposed closest to the display area DA, and the third dam DAM3 may be disposed farthest from the display area DA. The second dam DAM2 may be disposed between the first dam DAM1 and the third dam DAM3.

The first dam DAM1 and the second dam DAM2 may include first sub-dams SDAM1 and SDAM1' and second sub-dams SDAM2 and SDAM2' disposed on the first sub-dams SDAM1 and SDAM1', respectively. The first sub-dams SDAM1 and SDAM1' may include the same material as the bank 190. A thickness of the first sub-dams SDAM1 and SDAM1' and a thickness of the bank 190 may be substantially the same as each other. The second sub-dams SDAM2 and SDAM2' may include the same material as the spacer 191. A thickness of the second sub-dams SDAM2 and SDAM2' and a thickness of the space 191 may be substantially the same as each other.

The third dam DAM3 may include a first sub-dam SDAM1", a second sub-dam SDAM2" disposed on the first sub-dam SDAM1", and a third sub-dam SDAM3"disposed on the second sub-dam SDAM2. A thickness of the third dam DAM3 may be greater than that of the first dam DAM1 and that of the second dam DAM2.

The first sub-dam SDAM1" may include the same material as the second planarization film 180. The second sub-dam SDAM2" may include the same material as the bank 190. A thickness of the second sub-dam SDAM2" and the thickness of the bank 190 may be substantially the same as each other. The third sub-dam SDAM3" may include the same material as the spacer 191. A thickness of the third sub-dam SDAM3" and the thickness of the spacer 191 may be substantially the same as each other.

An inorganic encapsulation area CVDA may be disposed between the dam area DAMA and a mask support area MSA. The inorganic encapsulation area CVDA may be an area in which only an inorganic film is disposed and an organic film is not disposed. That is, in the inorganic encapsulation area CVDA, as illustrated in FIG. 14, the barrier film BR, the first gate insulating film 130, the first interlayer insulating film 141, the second interlayer insulating film 142, a second sub power supply line VSL2, the first encapsulation inorganic film TFE1, and the second encapsulation inorganic film TFE3 may be disposed. Permeation of oxygen or moisture into the light emitting elements LEL may be prevented due to the inorganic encapsulation area CVDA.

The mask support area MSA may be disposed farther from the display area DA than the dam area DAMA and the inorganic encapsulation area CVDA are. The mask support area MSA may include a mask support structure MSS. The mask support structure MSS may include a first structure MSS1, a second structure MSS2 disposed on the first structure MSS1, a third structure MSS3 disposed on the second structure MSS2, and a fourth structure MMS4 disposed on the third structure MSS3. A thickness of the mask support structure MSS may be greater than that of the third dam DAM3.

The first structure MSS1 may include the same material as the first planarization film 160. A thickness of the first structure MSS1 may be substantially the same as that of the first planarization film 160. The second structure MSS2 may include the same material as the second planarization film 180. A thickness of the second structure MSS2 may be substantially the same as that of the second planarization film 180. The third structure MSS3 may include the same material as the bank 190. A thickness of the third structure MSS3 and the thickness of the bank 190 may be substantially the same as each other. The fourth structure MSS4 may include the same material as the spacer 191. A thickness of the fourth structure MSS4 and the thickness of the spacer 191 may be substantially the same as each other.

The first power supply line VSL may include a first sub power supply line VSL1 and the second sub power supply line VSL2. The first sub power supply line VSL1 may be disposed in the dam area DAMA, and the second sub power supply line VSL2 may be disposed in the fan-out line area FLA, the dam area DAMA, the inorganic encapsulation area CVDA, and the mask support area MSA.

The first sub power supply line VSL1 may be disposed on the second interlayer insulating film 142 in the dam area DAMA. The first sub power supply line VSL1 may include the same material as the first anode connection electrode ANDE1.

The second sub power supply line VSL2 may be disposed on the first planarization film 160 in the fan-out line area FLA. The second sub power supply line VSL2 may be disposed first sub power supply line below the first sub-dam SDAM1" of the third dam DAM3 in the dam area DAMA. The second sub power supply line VSL2 may be in contact with the first sub power supply line VSL1 in the dam area DAMA. The second sub power supply line VSL2 may be disposed on the second interlayer insulating film 142 in the inorganic encapsulation area CVDA. The second sub power supply line VSL2 may be disposed on the first structure MSS1 in the mask support area MSA. The second sub power supply line VSL2 may include the same material as the second anode connection electrode ANDE2.

The second power supply line VDL may include a third sub power supply line VDL1 and a fourth sub power supply line VDL2. The third sub power supply line VDL1 and the fourth sub power supply line VDL2 may be disposed in the fan-out line area FLA.

The third sub power supply line VDL1 may be disposed on the second interlayer insulating film 142 in the fan-out line area FLA. The third sub power supply line VDL1 may include the same material as the first sub power supply line VSL1 and the first anode connection electrode ANDE1.

The fourth sub power supply line VDL2 may be disposed on the first planarization film 160 in the fan-out line area FLA. The fourth sub power supply line VDL2 may include the same material as the second sub power supply line VSL2 and the second anode connection electrode ANDE2.

The first encapsulation inorganic film TFE1 and the second encapsulation inorganic film TFE3 may be disposed in the fan-out line area FLA, the dam area DAMA, the inorganic encapsulation area CVDA, and the mask support area MSA. The encapsulation organic film TFE2 may be disposed in the fan-out line area FLA and the dam area DAMA.

The first encapsulation inorganic film TFE1 may be disposed on the second planarization film 180 in the fan-out line area FLA. The first encapsulation inorganic film TFE1 may be disposed on the first dam DAM1, the second dam DAM2, and the third dam DAM3 in the dam area DAMA. In addition, the first encapsulation inorganic film TFE1 may be disposed on the first power supply line VSL2 between the first dam DAM1 and the second dam DAM2 and between the second dam DAM2 and the third dam DAM3 in the dam area DAMA. The first encapsulation inorganic film TFE1 may be disposed on the second sub power supply line VSL2 in the inorganic encapsulation area CVDA. The first encapsulation inorganic film TFE1 may be disposed on the mask support structure MSS in the mask support area MSA.

The encapsulation organic film TFE2 may be disposed on the first encapsulation inorganic film TFE1 in the fan-out line area FLA and the dam area DAMA. It has been illustrated in FIG. 14 that the encapsulation organic film TFE2 is disposed to cover portions of the first dam DAM1 and the second dam DAM2 and not to cover the third dam DAM3 in the dam area DAMA, but the present disclosure is not limited thereto. For example, the encapsulation organic film TFE2 may be disposed to cover portions of the first dam DAM1, the second dam DAM2, and the third dam DAM3. Alternatively, the encapsulation organic film TFE2 may be disposed to cover a portion of the first dam DAM1 and not to cover the second dam DAM2 and the third dam DAM3.

The second encapsulation inorganic film TFE3 may be disposed on the encapsulation organic film TFE2 in the fan-out line area FLA. The second encapsulation inorganic film TFE3 may be disposed on the first encapsulation inorganic film TFE1 and the encapsulation organic film TFE3 in the dam area DAMA. The second encapsulation inorganic film TFE3 may be disposed on the first encapsulation inorganic film TFE1 in the inorganic encapsulation area CVDA. The second encapsulation inorganic film TFE3 may be disposed on the first encapsulation inorganic film TFE1 in the mask support area MSA.

The touch lines SL may be disposed on the second encapsulation inorganic film TFE3 in the fan-out line area FLA and the dam area DAMA.

Meanwhile, referring to FIGS. 12 to 14, in the non-display area NDA disposed at the lower side of the display panel 100, the first power supply line VSL and the second power supply line VDL may be disposed apart from each other. That is, the first power supply line VSL and the second power supply line VDL extending in the first direction DR1 in the non-display area NDA disposed at the lower side of the display panel 100 may not overlap each other.

At least one of the touch lines SL may be disposed between the first power supply line VSL and the second power supply line VDL extending in the first direction DR1 in the non-display area NDA disposed at the lower side of the display panel 100. Therefore, the touch line SL and at least one of the data fan-out lines DFL may overlap each other. Therefore, a parasitic capacitance may be formed between the touch line SL and the data fan-out line DFL. Due to the parasitic capacitance, the touch driving signal or the touch sensing signal of the touch line SL may be affected by a data voltage of the data fan-out line DFL.

Alternatively, the touch line SL and at least one of the scan fan-out lines SFL may overlap each other. Therefore, a parasitic capacitance may be formed between the touch line SL and the scan fan-out line SFL. Due to the parasitic capacitance, the touch driving signal or the touch sensing signal of the touch line SL may be affected by a scan control signal of the scan fan-out line SFL.

Therefore, when the touch driving signal or the touch sensing signal of the touch line SL is affected by the data voltage of the data fan-out line DFL or is affected by the scan control signal of the scan fan-out line SFL, a touch sensing error may occur. For example, the touch sensing error may include an error that a touch is not recognized even though the touch is generated, an error that a touch is recognized even though the touch is not generated, and the like.

Figure 15:
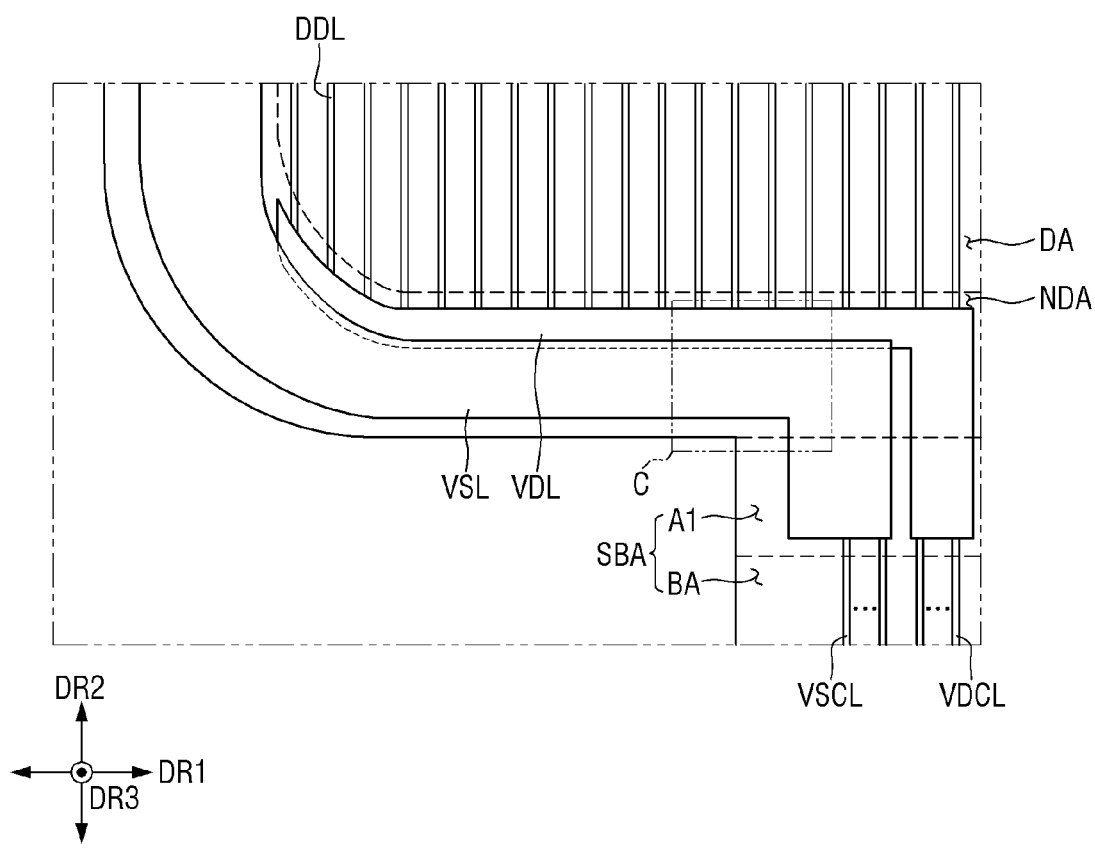
FIG. 15 is a layout diagram illustrating a non-display area of the display panel according to another exemplary embodiment.
Figure 16:
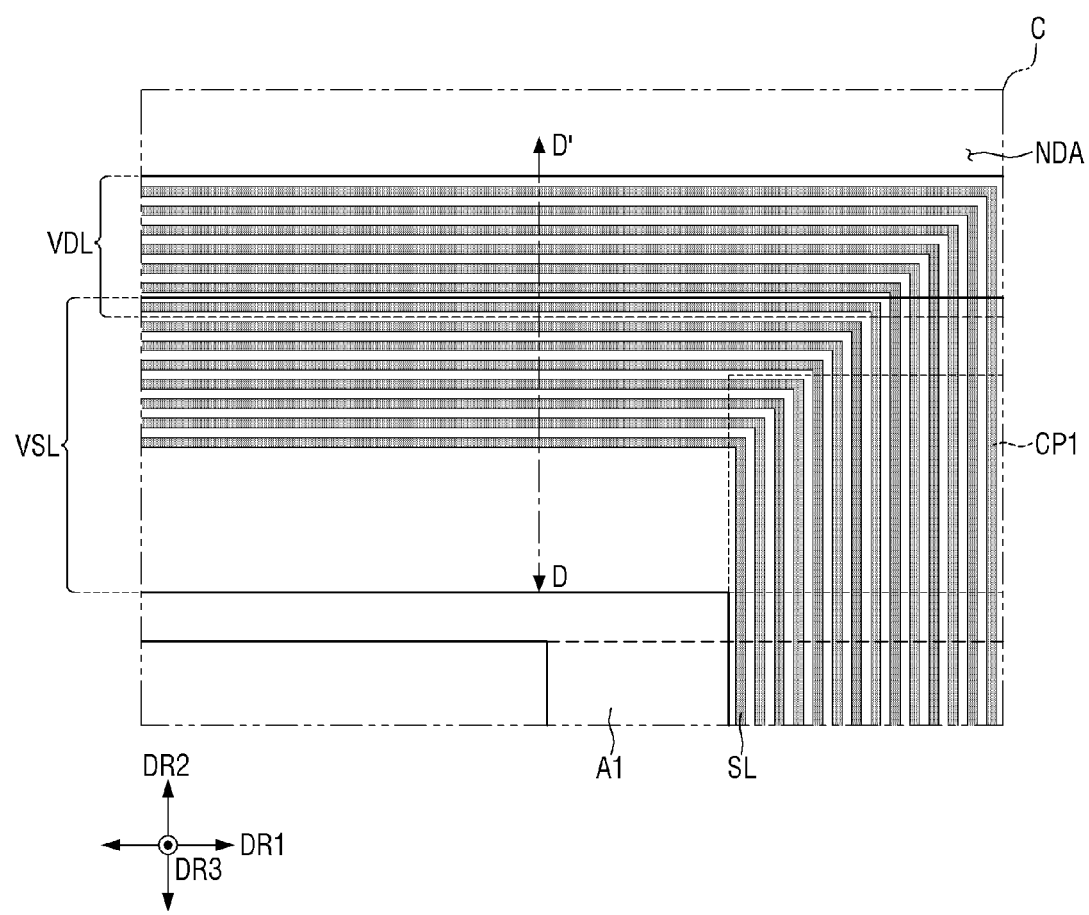
FIG. 16 is a layout diagram illustrating another example of region C of FIG. 15 in detail.
Figure 17:
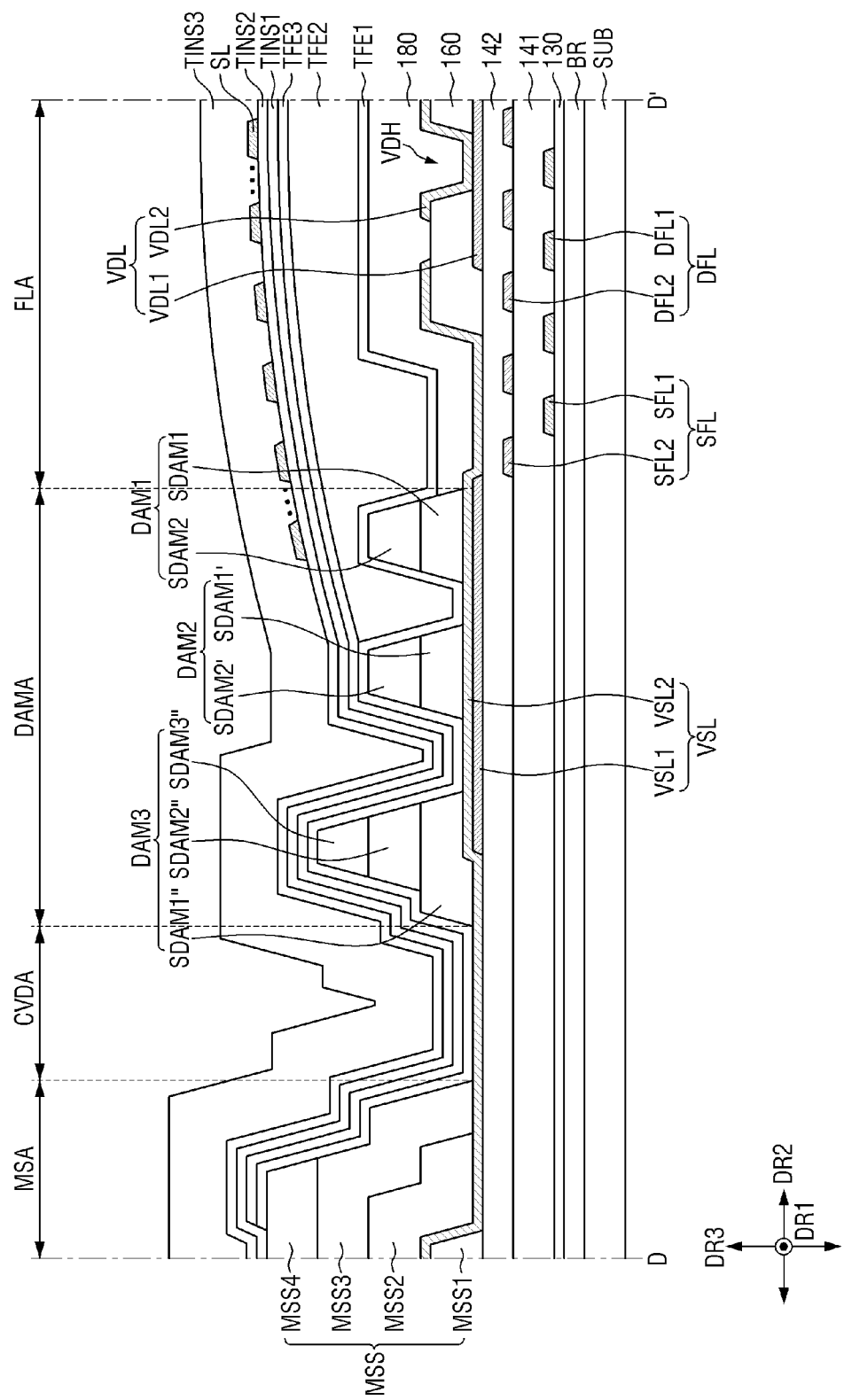
FIG. 17 is a cross-sectional view illustrating an example of the display panel taken along line D-D' of FIG. 16.
Figure 18:
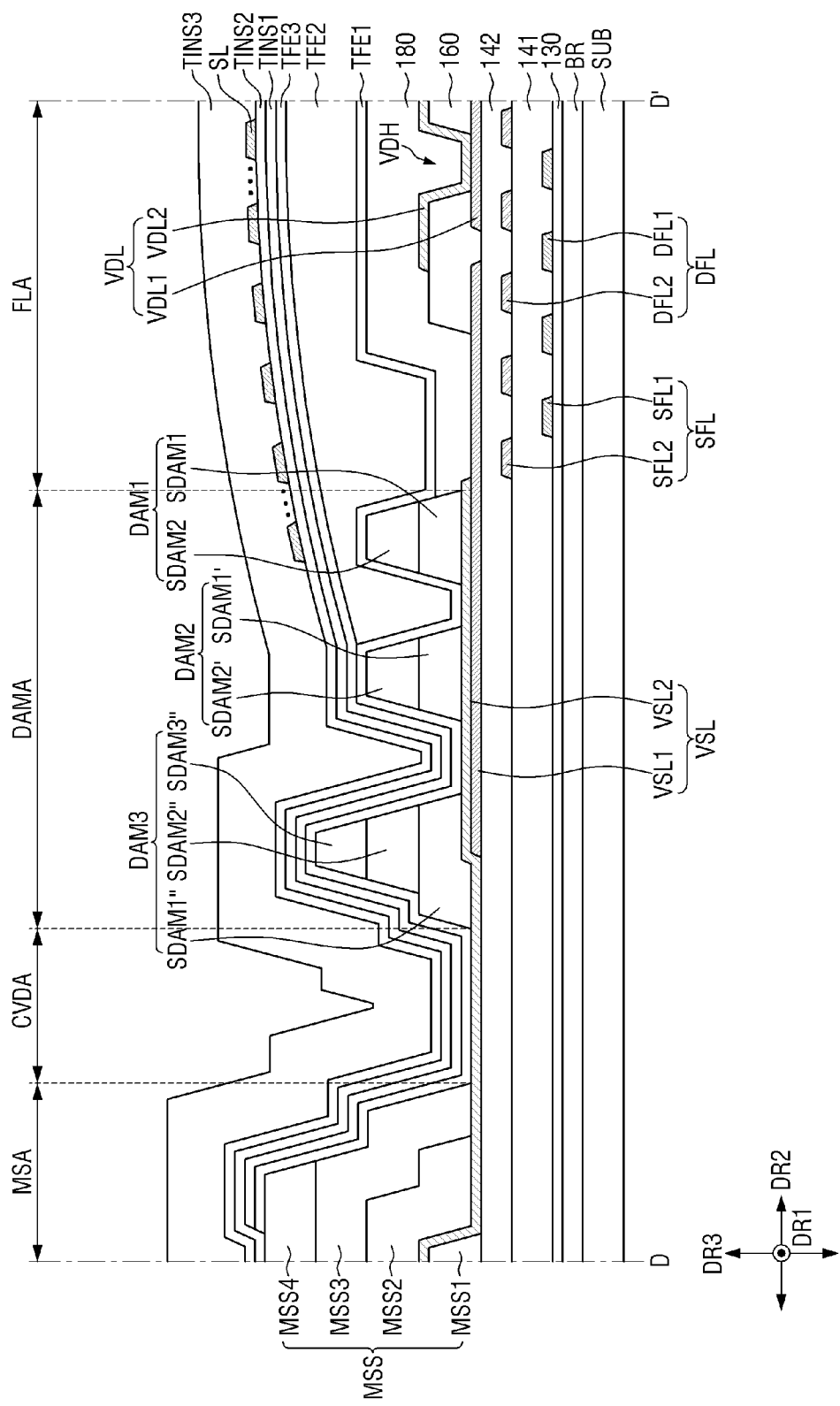
FIG. 18 is a cross-sectional view illustrating another example of the display panel taken along line D-D' of FIG. 16.

FIG. 15 is a layout diagram illustrating a non-display area of the display panel according to another exemplary embodiment. FIG. 16 is a layout diagram illustrating another example of region C of FIG. 15 in detail. FIG. 17 is a cross-sectional view illustrating an example of the display panel taken along line D-D' of FIG. 16. FIG. 18 is a cross-sectional view illustrating another example of the display panel taken along line D-D' of FIG. 16.

An exemplary embodiment of FIGS. 15 to 18 is different from an exemplary embodiment of FIGS. 12 to 14 in that the first power supply line VSL overlaps the second power supply line VDL, such that the first power supply line VSL or the second power supply line VDL is disposed between the touch line SL and the data fan-out line DFL or the scan fan-out line SFL. In FIGS. 15 to 18, a description overlapping that of FIGS. 12 to 14 will be omitted.

Referring to FIGS. 15 to 18, in the non-display area NDA disposed at the lower side of the display panel 100, the first power supply line VSL and the second power supply line VDL may overlap each other. That is, the first power supply line VSL and the second power supply line VDL extending in the first direction DR1 in the non-display area NDA disposed at the lower side of the display panel 100 may overlap each other. For example, in the fan-out line area FLA, the second sub power supply line VSL2 and the third sub power supply line VDL1 may overlap each other as illustrated in FIG. 17. Alternatively, in the fan-out line area FLA, the first sub power supply line VSL1 and the fourth sub power supply line VDL2 may overlap each other as illustrated in FIG. 18.

Since the first power supply line VSL and the second power supply line VDL overlap each other in the non-display area NDA disposed at the lower side of the display panel 100, the first power supply line VSL or the second power supply line VDL may be disposed between the touch line SL and the data fan-out line DFL or the scan fan-out line SFL. Therefore, it is possible to prevent a parasitic capacitance from being formed between the touch line SL and the data fan-out line DFL and between the touch line SL and the scan fan-out line SFL. Therefore, it is possible to prevent the touch driving signal or the touch sensing signal of the touch line SL from being affected by the data voltage of the data fan-out line DFL or being affected by the scan control signal of the scan fan-out line SFL, and it is thus possible to prevent a touch sensing error from occurring.

Figure 19:
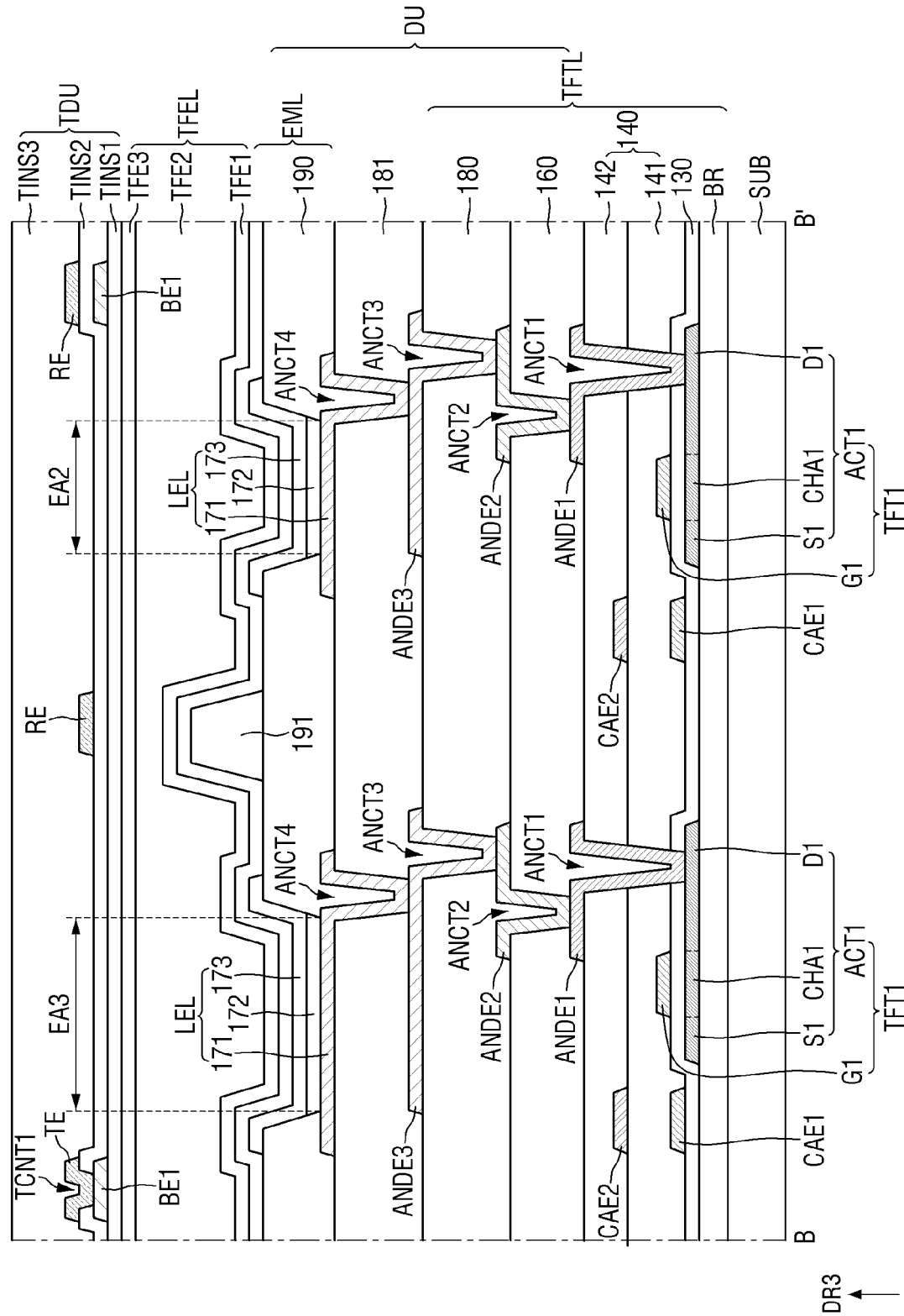
FIG. 19 is a cross-sectional view illustrating another example of the display panel taken along line B-B' of FIG. 10.
Figure 20:
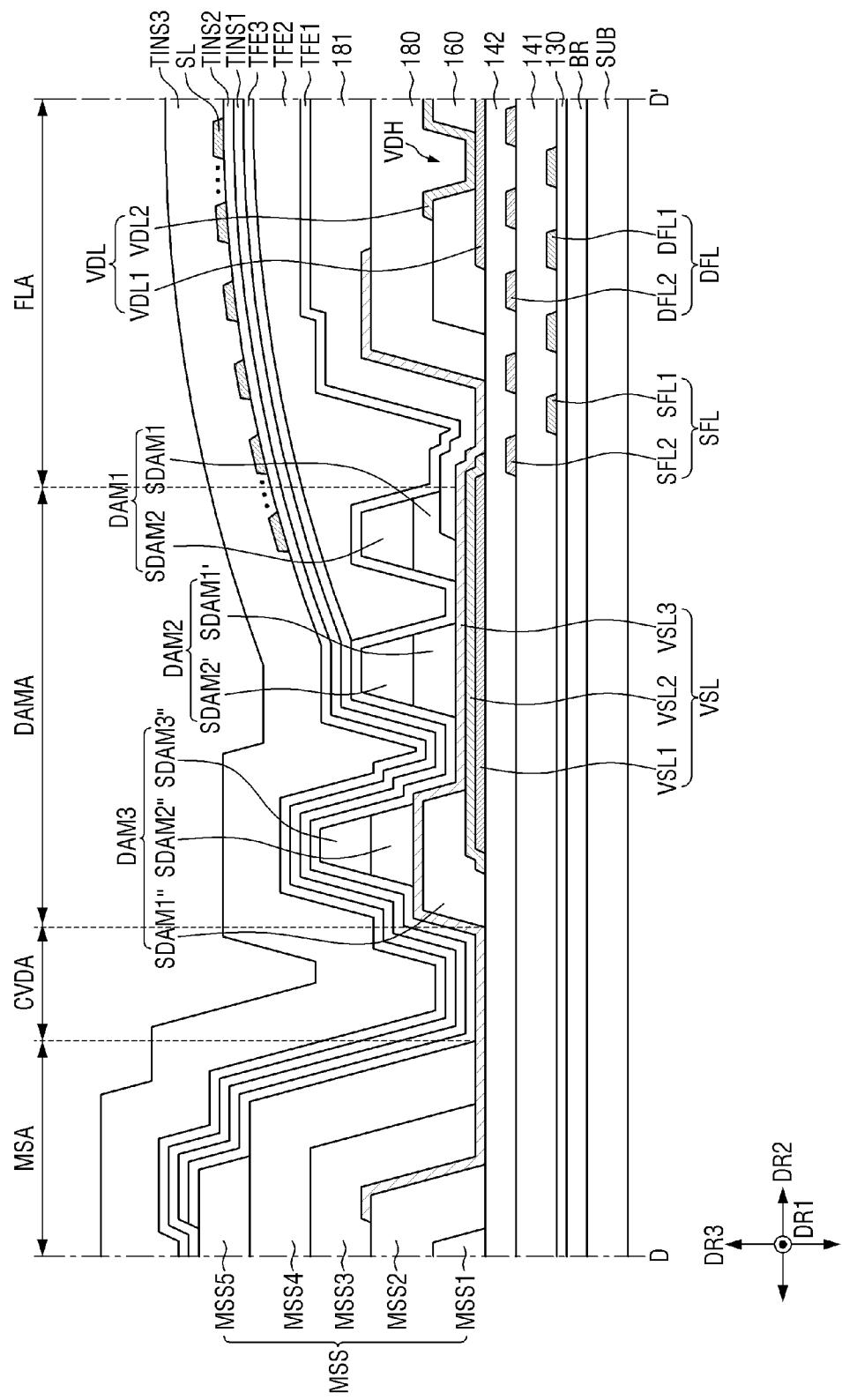
FIG. 20 is a cross-sectional view illustrating still another example of the display panel taken along line D-D' of FIG. 16.
Figure 21:
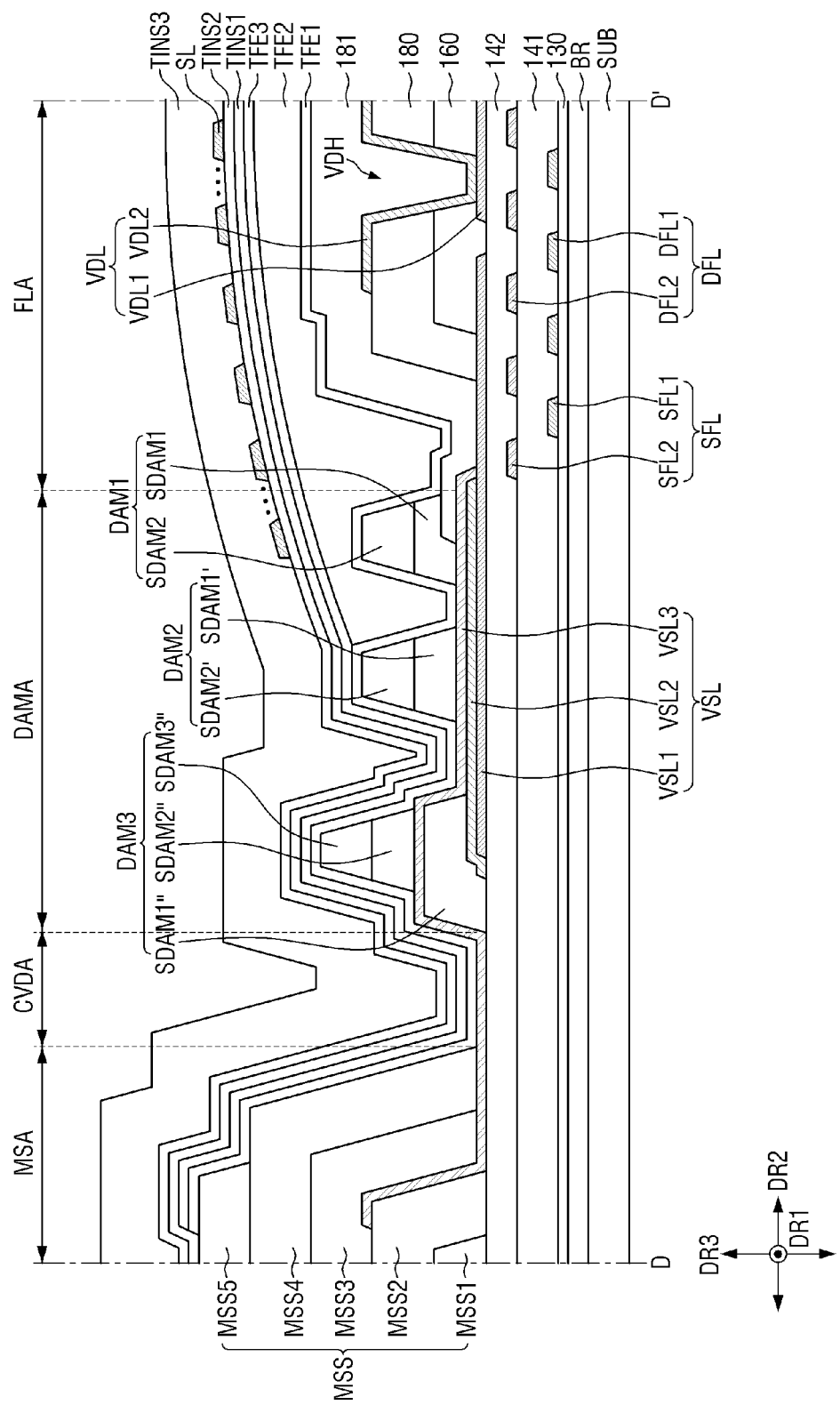
FIG. 21 is a cross-sectional view illustrating still another example of the display panel taken along line D-D' of FIG. 16.

FIG. 19 is a cross-sectional view illustrating still another example of the display panel taken along line B-B' of FIG. 10. FIG. 20 is a cross-sectional view illustrating still another example of the display panel taken along line D-D' of FIG. 16. FIG. 21 is a cross-sectional view illustrating still another example of the display panel taken along line D-D' of FIG. 16.

An exemplary embodiment of FIGS. 19 to 21 is different from exemplary embodiments of FIGS. 11, 17 and 18 in that the display panel 100 further includes a third planarization film 181 and a third anode connection electrode ANDE3. In FIGS. 19 to 21, a description overlapping that of exemplary embodiments of FIGS. 11, 17 and 18 will be omitted.

Referring to FIGS. 19 to 21, the third anode connection electrode ANDE3 may be disposed on the second planarization film 180. The third anode connection electrode ANDE3 may be connected to the second anode connection electrode ANDE2 through a third connection contact hole ANCT3 penetrating through the second planarization film 180. The third anode connection electrode ANDE3 may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

The third planarization film 181 may be disposed on the third anode connection electrode ANDE3. The third planarization film 181 may be formed as an organic film made of an acryl resin, an epoxy resin, a phenolic resin, a polyamide resin, a polyimide resin, or the like.

The light emitting elements LEL and the bank 190 may be disposed on the third planarization film 181. The pixel electrode 171 of each of the light emitting elements LEL may be disposed on the third planarization film 181. The pixel electrode 171 may be connected to the third anode connection electrode ANDE3 through a fourth connection contact hole ANCT4 penetrating through the third planarization film 181.

The mask support structure MSS may include a first structure MSS1, a second structure MSS2 disposed on the first structure MSS1, a third structure MSS3 disposed on the second structure MSS2, a fourth structure MMS4 disposed on the third structure MSS3, and a fifth structure MMS5 disposed on the fourth structure MMS4. The first structure MSS1 may include the same material as the first planarization film 160. A thickness of the first structure MSS1 may be substantially the same as that of the first planarization film 160. The second structure MSS2 may include the same material as the second planarization film 180. A thickness of the second structure MSS2 may be substantially the same as that of the second planarization film 180. The third structure MSS3 may include the same material as the third planarization film 181. A thickness of the third structure MSS3 may be substantially the same as that of the third planarization film 181. The fourth structure MSS4 may include the same material as the bank 190. A thickness of the fourth structure MSS4 and a thickness of the bank 190 may be substantially the same as each other. The fifth structure MSS5 may include the same material as the spacer 191. A thickness of the fifth structure MSS5 and a thickness of the spacer 191 may be substantially the same as each other.

The first power supply line VSL may include a first sub power supply line VSL1, the second sub power supply line VSL2, and a fifth sub power supply line VSL3. The first sub power supply line VSL1 and the second sub power supply line VSL2 may be disposed in the dam area DAMA, and the fifth sub power supply line VSL3 may be disposed in the fan-out line area FLA, the dam area DAMA, the inorganic encapsulation area CVDA, and the mask support area MSA.

The first sub power supply line VSL1 may be disposed on the second interlayer insulating film 142 in the dam area DAMA. The first sub power supply line VSL1 may include the same material as the first anode connection electrode ANDE1.

The second sub power supply line VSL2 may be disposed on the first sub power supply line VSL1 in the dam area DAMA. The second sub power supply line VSL2 may be disposed to cover the first sub power supply line VSL1. That is, the second sub power supply line VSL2 may be disposed on an upper surface and side surfaces of the first sub power supply line VSL1. The second sub power supply line VSL2 may include the same material as the second anode connection electrode ANDE2.

The fifth sub power supply line VSL3 may be disposed on the second planarization film 160 in the fan-out line area FLA. The fifth sub power supply line VSL3 may be disposed on the second sub power supply line VSL2 and the first sub-dam SDAM1" of the third dam DAM3 in the dam area DAMA. The fifth sub power supply line VSL3 may be in contact with an upper surface and side surfaces of the second sub power supply line VSL2 in the dam area DAMA. The fifth sub power supply line VSL3 may be disposed on the second interlayer insulating film 142 in the inorganic encapsulation area CVDA. The fifth sub power supply line VSL3 may be disposed on the second structure MSS2 in the mask support area MSA. The fifth sub power supply line VSL3 may include the same material as the third anode connection electrode ANDE3.

The second power supply line VDL may include a third sub power supply line VDL1 and a fourth sub power supply line VDL2. The third sub power supply line VDL1 and the fourth sub power supply line VDL2 may be disposed in the fan-out line area FLA.

The third sub power supply line VDL1 may be disposed on the second interlayer insulating film 142 in the fan-out line area FLA. The third sub power supply line VDL1 may include the same material as the first sub power supply line VSL1 and the first anode connection electrode ANDE1.

The fourth sub power supply line VDL2 may be disposed on the first planarization film 160 in the fan-out line area FLA. In this case, the fourth sub power supply line VDL2 may include the same material as the second sub power supply line VSL2 and the second anode connection electrode ANDE2. Alternatively, the fourth sub power supply line VDL2 may be disposed on the second planarization film 180 in the fan-out line area FLA. In this case, the fourth sub power supply line VDL2 may include the same material as the fifth sub power supply line VSL3 and the third anode connection electrode ANDE3.

In the fan-out line area FLA, the fifth sub power supply line VSL3 and the third sub power supply line VDL1 may overlap each other as illustrated in FIG. 20. As illustrated in FIG. 20, the first planarization film 160 and the second planarization film 180 may be disposed between the fifth sub power supply line VSL3 and the third sub power supply line VDL1 in the third direction DR3, while as illustrated in FIG. 17, the first planarization film 160 may be disposed between the second sub power supply line VSL2 and the third sub power supply line VDL1 in the third direction DR3. When only the first planarization film 160 is disposed between the second sub power supply line VSL2 and the third sub power supply line VDL1 in the third direction DR3 as illustrated in FIG. 17, a distance between the third sub power supply line VDL1 and the second sub power supply line VSL2 is short, and thus, a burnt failure may occur according to a difference between a second power supply voltage of the third sub power supply line VDL1 and a first power supply voltage of the second sub power supply line VSL2. However, when a distance between the fifth sub power supply line VSL3 and the third sub power supply line VDL1 in the third direction DR3 as illustrated in FIG. 20 is greater than the distance between the second sub power supply line VSL2 and the third sub power supply line VDL1 in the third direction DR3 as illustrated in FIG. 17, it is possible to reduce the occurrence of a burnt failure according to a potential difference between a second power supply voltage of the third sub power supply line VDL1 and a first power supply voltage of the fifth sub power supply line VSL3.

Alternatively, in the fan-out line area FLA, the first sub power supply line VSL1 and the fourth sub power supply line VDL2 may overlap each other as illustrated in FIG. 21. As illustrated in FIG. 21, the first planarization film 160 and the second planarization film 180 may be disposed between the first sub power supply line VSL1 and the fourth sub power supply line VDL2 in the third direction DR3, while as illustrated in FIG. 18, the first planarization film 160 may be disposed between the first sub power supply line VSL1 and the fourth sub power supply line VDL2 in the third direction DR3. When only the first planarization film 160 is disposed between the first sub power supply line VSL1 and the fourth sub power supply line VDL2 in the third direction DR3 as illustrated in FIG. 18, a distance between the first sub power supply line VSL1 and the fourth sub power supply line VDL2 is short, and thus, a burnt failure may occur according to a difference between a second power supply voltage of the fourth sub power supply line VDL2 and a first power supply voltage of the first sub power supply line VSL1. However, when a distance between the first sub power supply line VSL1 and the fourth sub power supply line VDL2 in the third direction DR3 as illustrated in FIG. 21 is greater than the distance between the first sub power supply line VSL1 and the fourth sub power supply line VDL2 in the third direction DR3 as illustrated in FIG. 18, it is possible to reduce the occurrence of a burnt failure according to a potential difference between a second power supply voltage of the third sub power supply line VDL1 and a first power supply voltage of the second sub power supply line VSL2.

Since the first power supply line VSL and the second power supply line VDL overlap each other in the non-display area NDA disposed at the lower side of the display panel 100, the first power supply line VSL or the second power supply line VDL may be disposed between the touch line SL and the data fan-out line DFL or the scan fan-out line SFL. Therefore, it is possible to prevent a parasitic capacitance from being formed between the touch line SL and the data fan-out line DFL and between the touch line SL and the scan fan-out line SFL. Therefore, it is possible to prevent the touch driving signal or the touch sensing signal of the touch line SL from being affected by the data voltage of the data fan-out line DFL or being affected by the scan control signal of the scan fan-out line SFL, and it is thus possible to prevent a touch sensing error from occurring.

Figure 22:
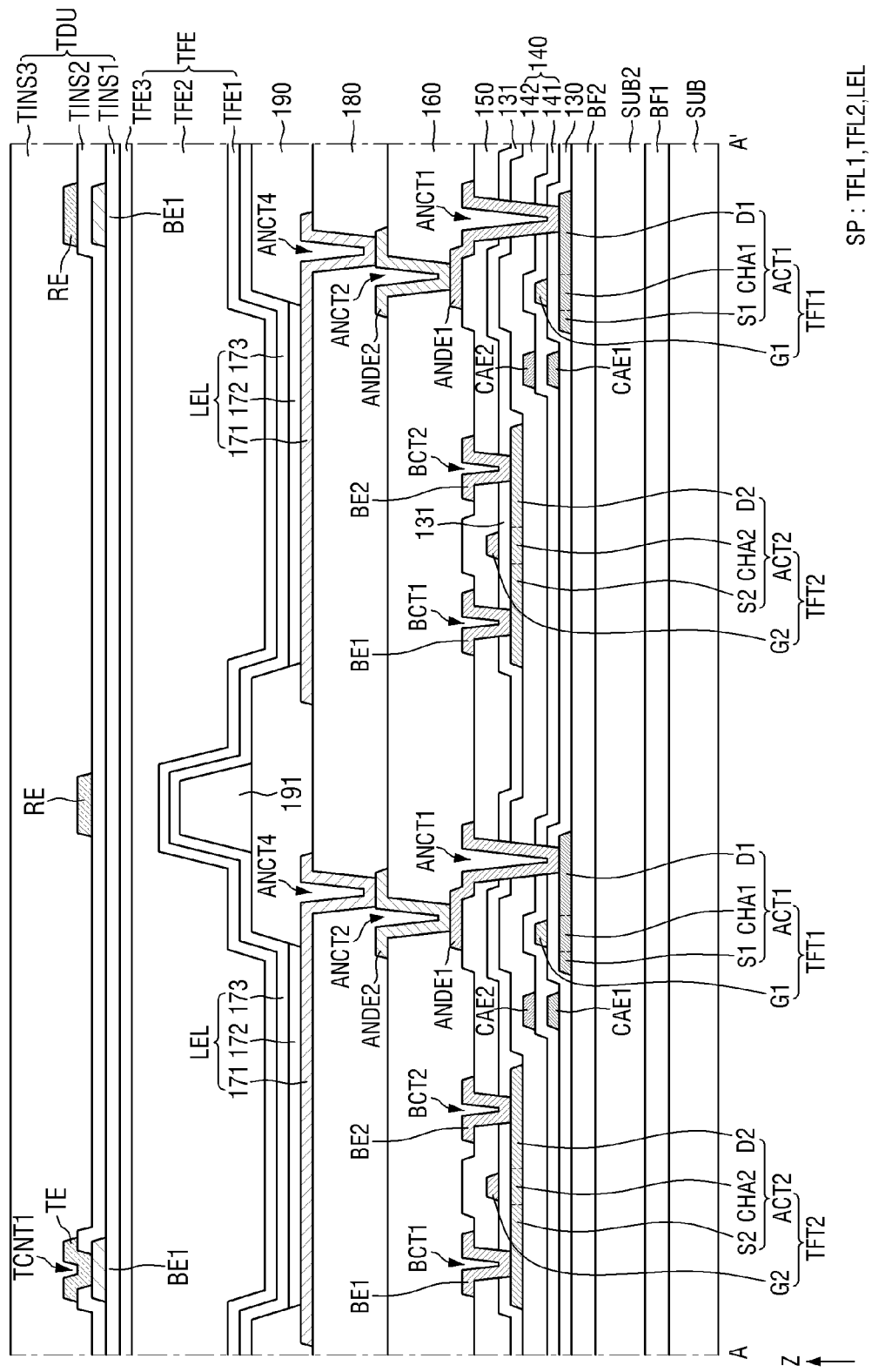
FIG. 22 is a cross-sectional view illustrating still another example of the display panel taken along line B-B' of FIG. 10.
Figure 23:
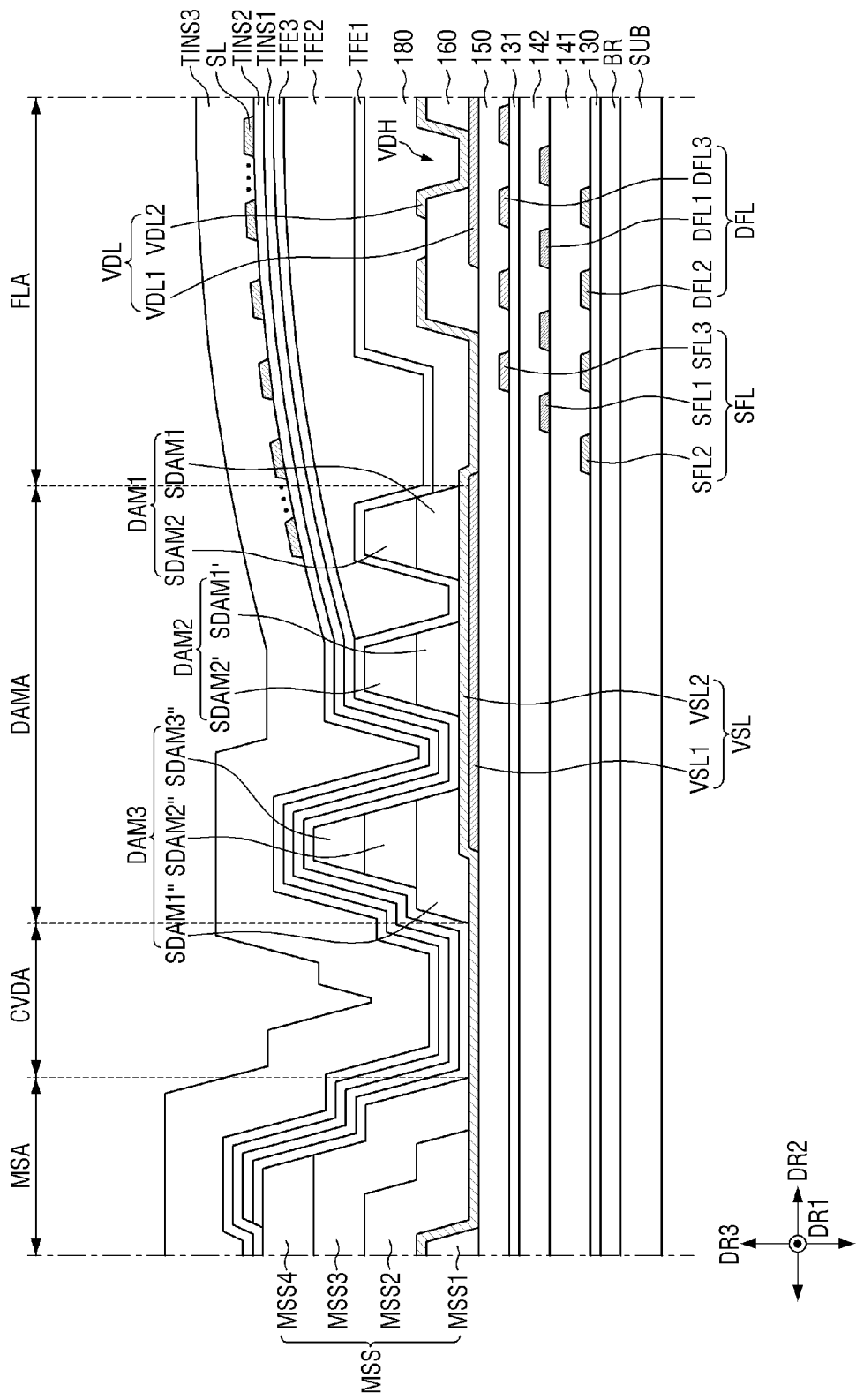
FIG. 23 is a cross-sectional view illustrating still another example of the display panel taken along line D-D' of FIG. 16.
Figure 24:
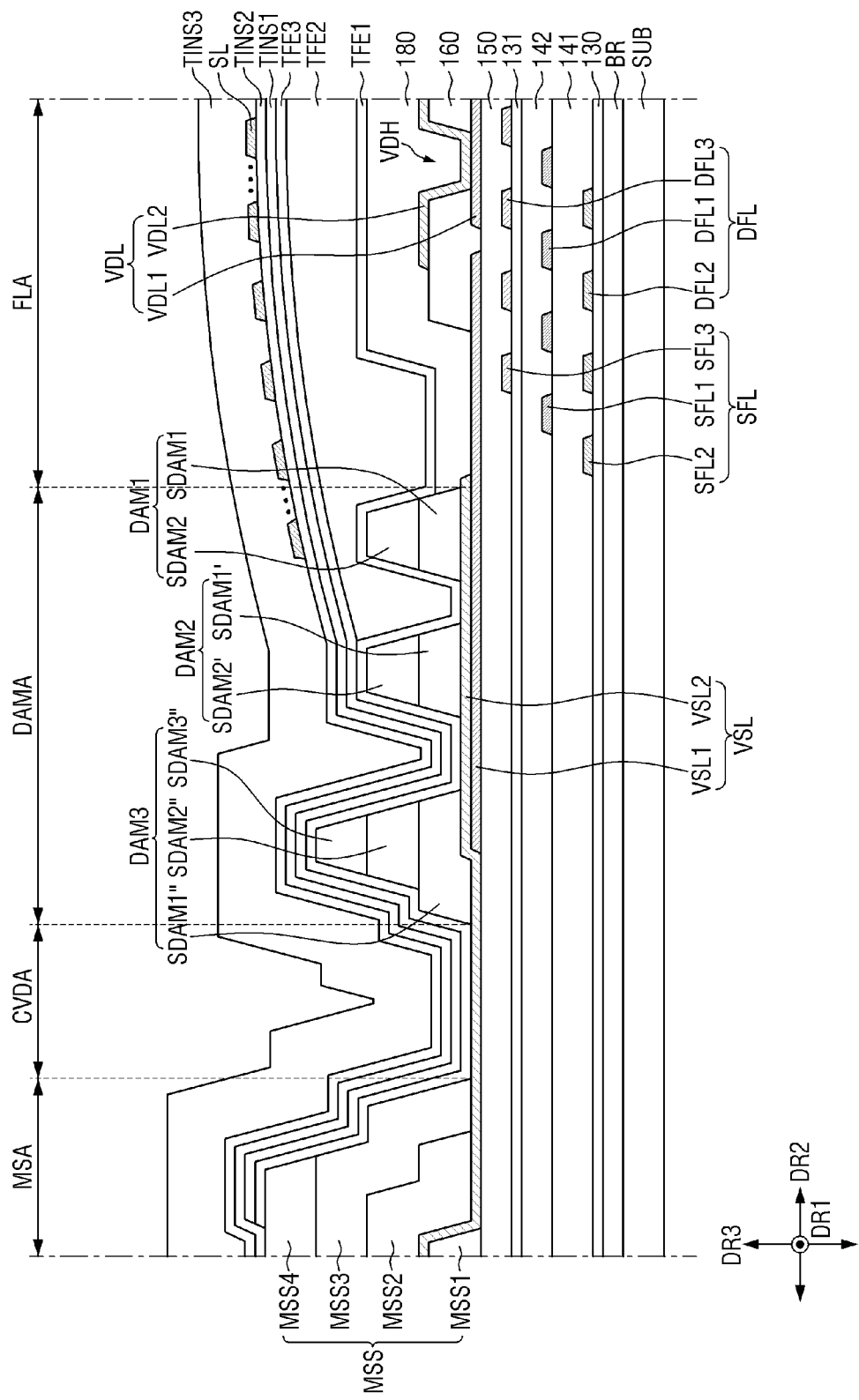
FIG. 24 is a cross-sectional view illustrating still another example of the display panel taken along line D-D' of FIG. 16.

FIG. 22 is a cross-sectional view illustrating still another example of the display panel taken along line B-B' of FIG. 10. FIG. 23 is a cross-sectional view illustrating still another example of the display panel taken along line D-D' of FIG. 16. FIG. 24 is a cross-sectional view illustrating still another example of the display panel taken along line D-D' of FIG. 16.

An exemplary embodiment of FIGS. 22 to 24 is different from exemplary embodiments of FIGS. 11, 17 and 18 in that the display panel 100 further includes second thin film transistors TFT2 each having a second active layer ACT2 and a second gate electrode G2, a second gate insulating film 131, a third interlayer insulating film 150, first connection electrodes BE1, second connection electrodes BE2, a third data fan-out line DFL3, and a third scan fan-out line SFL3. In FIGS. 19 to 21, a description overlapping that of exemplary embodiments of FIGS. 11, 17 and 18 will be omitted.

Referring to FIGS. 22 to 24, the second thin film transistor TFT2 may be disposed on the second interlayer insulating film 142. The second thin film transistor TFT2 may be any one of the first transistor ST1 and the third transistor ST3 illustrated in FIGS. 6 to 8, and the fourth transistor ST4 illustrated in FIG. 8. The second thin film transistor TFT2 may include the second active layer ACT2 and the second gate electrode G2.

The second active layer ACT2 of the second thin film transistor TFT2 may be disposed on the second interlayer insulating film 142. The second active layer ACT2 may include an oxide semiconductor. For example, the second active layer ACT2 may include IGZO (indium (In), gallium (Ga), zinc (Zn), and oxygen (O)), IGZTO (indium (In), gallium (Ga), zinc (Zn), tin (Sn), and oxygen (O)), or IGTO (indium (In), gallium (Ga), tin (Sn) and oxygen (O)).

The second active layer ACT2 may include a second channel region CHA2, a second source region S2, and a second drain region D2. The second channel region CHA2 may be a region overlapping the second gate electrode G2 in the third direction DR3. The second source region S2 may be disposed on one side of the second channel region CHA2, and the second drain region D2 may be disposed on the other side of the second channel region CHA2. The second source region S2 and the second drain region D2 may be regions that do not overlap the second gate electrode G2 in the third direction DR3. The second source region S2 and the second drain region D2 may be regions having conductivity by doping an oxide semiconductor with ions or impurities.

The second gate insulating film 131 may be disposed on the second active layer ACT2 of the second thin film transistor TFT2. The second gate insulating film 131 may be formed as an inorganic film, for example, a silicon nitride layer, a silicon oxynitride layer, a silicon oxide layer, a titanium oxide layer, or an aluminum oxide layer.

The second gate electrode G2 of the second thin film transistor TFT2 may be disposed on the second gate insulating film 132. The second gate electrode G2 may overlap the second active layer ACT2 in the third direction DR3. The second gate electrode G2 may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

The third interlayer insulating film 150 may be disposed on the second gate electrode G2 of the second thin film transistor TFT2. The third interlayer insulating film 150 may be formed as an inorganic film, for example, a silicon nitride layer, a silicon oxynitride layer, a silicon oxide layer, a titanium oxide layer, or an aluminum oxide layer. The third interlayer insulating film 150 may be formed as a plurality of inorganic films.

The first anode connection electrode ANDE1, the first connection electrode BE1, and the second connection electrode BE2 may be disposed on the third interlayer insulating film 150. The first anode connection electrode ANDE1 may be connected to the first drain region D1 of the first active layer ACT1 through a first anode contact hole ANCT1 penetrating through the first interlayer insulating film 141, the second interlayer insulating film 142, the second gate insulating film 131, and the third interlayer insulating film 150. The first connection electrode BE1 may be connected to the second source region S2 of the second active layer ACT2 through a first connection contact hole BCT1 penetrating through the third interlayer insulating film 150. The second connection electrode BE2 may be connected to the second drain region D2 of the second active layer ACT2 through a second connection contact hole BCT2 penetrating through the third interlayer insulating film 150. Each of the first anode connection electrode ANDE1, the first connection electrode BE1, and the second connection electrode BE2 may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

The data fan-out lines DFL may include first data fan-out lines DFL1 disposed on the first gate insulating film 130, second data fan-out lines DFL2 disposed on the first interlayer insulating film 141, and third data fan-out lines DFL3 disposed on the second gate insulating film 131. In addition, the scan fan-out lines SFL may include first scan fan-out lines SFL1 disposed on the first gate insulating film 130, second scan fan-out lines SFL2 disposed on the first interlayer insulating film 141, and third scan fan-out lines SFL3 disposed on the second gate insulating film 131.

The first data fan-out lines DFL1 and the first scan fan-out lines SFL1 may be disposed on the same layer as the first gate electrode G1 and the first capacitor electrode CAE1, and may include the same material as the first gate electrode G1 and the first capacitor electrode CAE1. In addition, the second data fan-out lines DFL2 and the second scan fan-out lines SFL2 may be disposed on the same layer as the second capacitor electrode CAE2, and may include the same material as the second capacitor electrode CAE2. In addition, the third data fan-out lines DFL3 and the third scan fan-out lines SFL3 may be disposed on the same layer as the second gate electrode G2, and may include the same material as the second gate electrode G2.

The first data fan-out lines DFL1, the second data fan-out lines DFL2, and the third data fan-out lines DFL3 may be alternately disposed in the second direction DR2. That is, the first data fan-out lines DFL1, the second data fan-out lines DFL2, and the third data fan-out lines DFL3 may be disposed in the order of the first data fan-out line DFL1, the second data fan-out line DFL2, the third data fan-out line DFL3, the first data fan-out line DFL1, the second data fan-out line DFL2, and the third data fan-out line DFL3 in the second direction DR2.

The first scan fan-out lines SFL1, the second scan fan-out lines SFL2, and the third scan fan-out lines SFL3 may be alternately disposed in the second direction DR2. That is, the first scan fan-out lines SFL1, the second scan fan-out lines SFL2, and the third scan fan-out lines SFL3 may be disposed in the order of the first scan fan-out line SFL1, the second scan fan-out line SFL2, the third scan fan-out line SFL3, the first scan fan-out line SFL1, the second scan fan-out line SFL2, and the third scan fan-out line SFL3 in the second direction DR2.

In the fan-out line area FLA, the second sub power supply line VSL2 and the third sub power supply line VDL1 may overlap each other as illustrated in FIG. 23. Alternatively, in the fan-out line area FLA, the first sub power supply line VSL1 and the fourth sub power supply line VDL2 may overlap each other as illustrated in FIG. 24.

Since the first power supply line VSL and the second power supply line VDL overlap each other in the non-display area NDA disposed at the lower side of the display panel 100, the first power supply line VSL or the second power supply line VDL may be disposed between the touch line SL and the data fan-out line DFL or the scan fan-out line SFL. Therefore, it is possible to prevent a parasitic capacitance from being formed between the touch line SL and the data fan-out line DFL and between the touch line SL and the scan fan-out line SFL. Therefore, it is possible to prevent the touch driving signal or the touch sensing signal of the touch line SL from being affected by the data voltage of the data fan-out line DFL or being affected by the scan control signal of the scan fan-out line SFL, and it is thus possible to prevent a touch sensing error from occurring.

Figure 25:
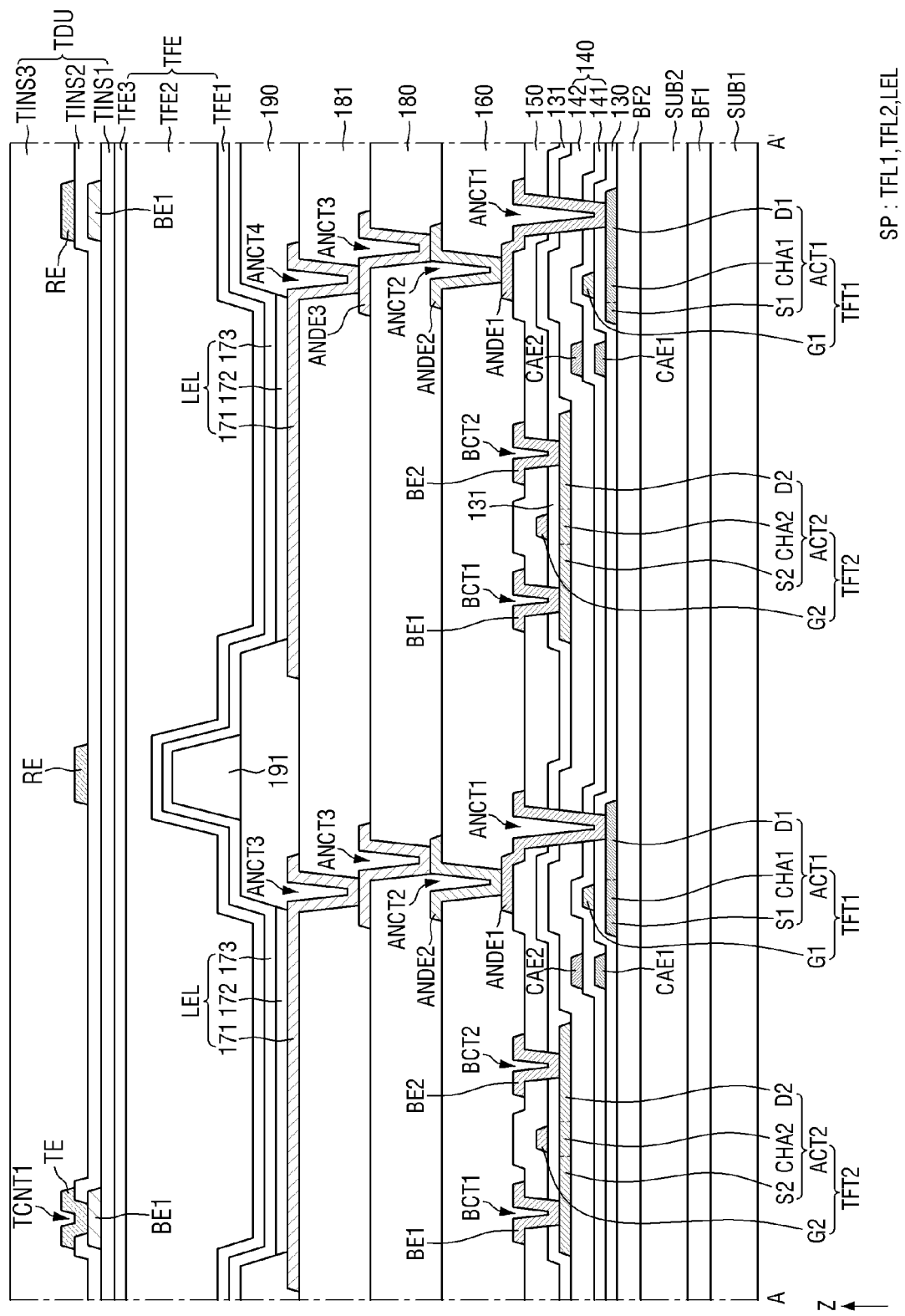
FIG. 25 is a cross-sectional view illustrating still another example of the display panel taken along line B-B' of FIG. 10.
Figure 26:
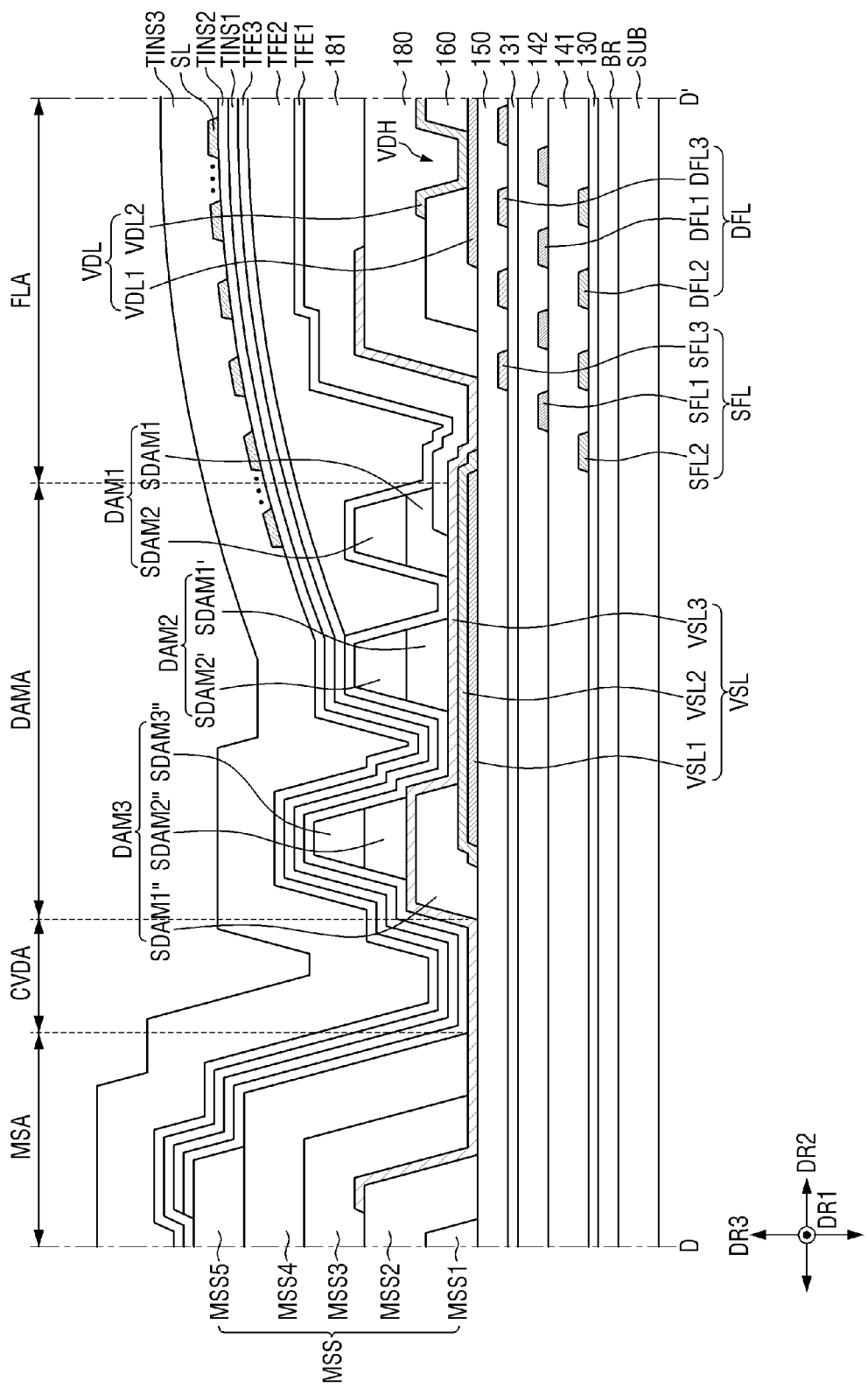
FIG. 26 is a cross-sectional view illustrating still another example of the display panel taken along line D-D' of FIG. 16.
Figure 27:
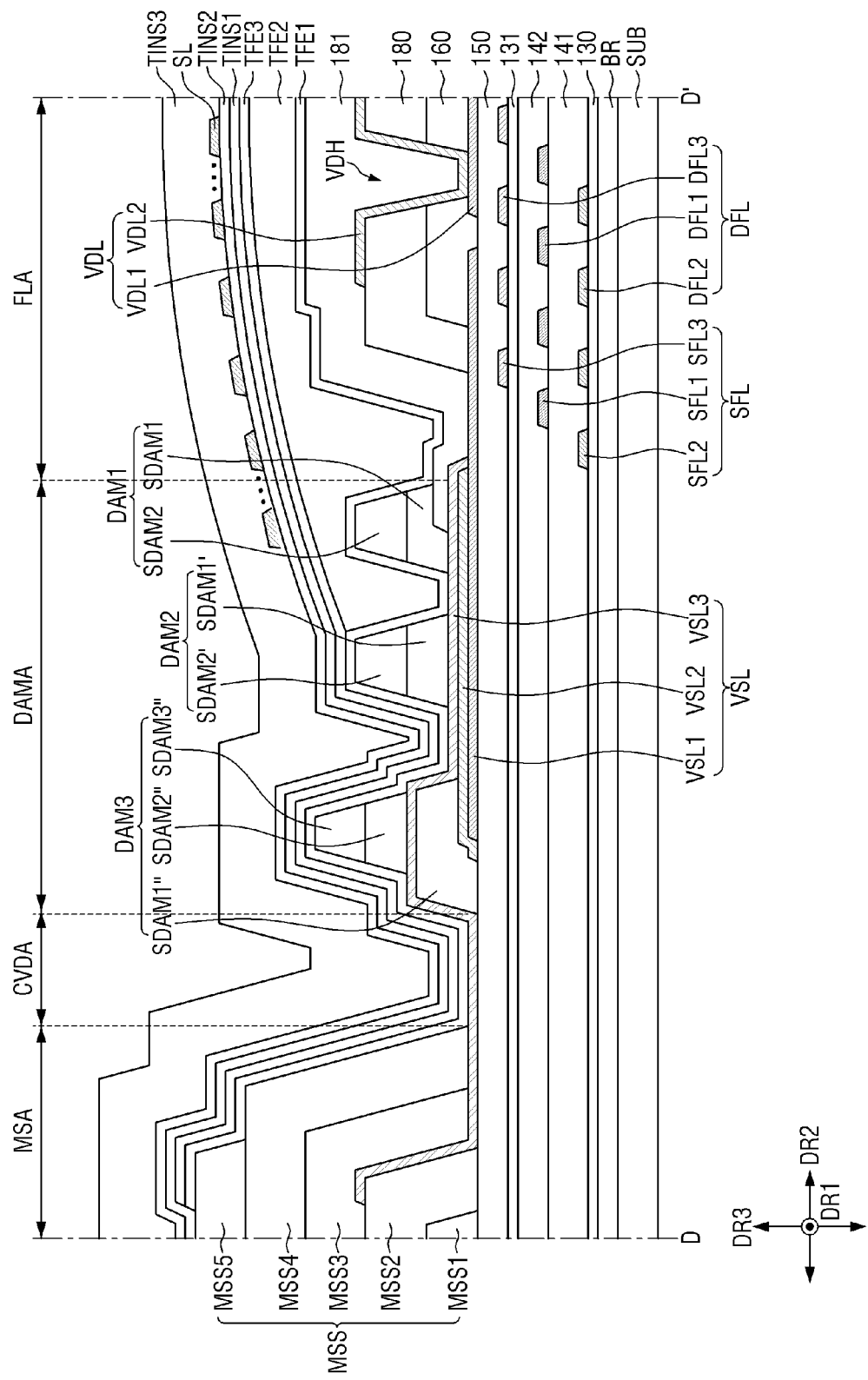
FIG. 27 is a cross-sectional view illustrating still another example of the display panel taken along line D-D' of FIG. 16.

FIG. 25 is a cross-sectional view illustrating still another example of the display panel taken along line B-B' of FIG. 10. FIG. 26 is a cross-sectional view illustrating still another example of the display panel taken along line D-D' of FIG. 16. FIG. 27 is a cross-sectional view illustrating still another example of the display panel taken along line D-D' of FIG. 16.

An exemplary embodiment of FIGS. 25 to 27 is different from an exemplary embodiment of FIGS. 19 to 21 in that the display panel 100 further includes second thin film transistors TFT2 each having a second active layer ACT2 and a second gate electrode G2, a second gate insulating film 131, a third interlayer insulating film 150, first connection electrodes BE1, second connection electrodes BE2, a third data fan-out line DFL3, and a third scan fan-out line SFL3. In FIGS. 25 to 27, the second thin film transistor TFT2 having the second active layer ACT2 and the second gate electrode G2, the second gate insulating film 131, the third interlayer insulating film 150, the first connection electrode BE1, the second connection electrode BE2, the third data fan-out line DFL3, and the third scan fan-out line SFL3 may be substantially the same as those described with reference to FIGS. 22 to 24.

In the fan-out line area FLA, the fifth sub power supply line VSL3 and the third sub power supply line VDL1 may overlap each other as illustrated in FIG. 26. As illustrated in FIG. 26, the first planarization film 160 and the second planarization film 180 may be disposed between the fifth sub power supply line VSL3 and the third sub power supply line VDL1 in the third direction DR3, while as illustrated in FIG. 17, the first planarization film 160 may be disposed between the second sub power supply line VSL2 and the third sub power supply line VDL1 in the third direction DR3. When a distance between the fifth sub power supply line VSL3 and the third sub power supply line VDL1 in the third direction DR3 as illustrated in FIG. 26 is greater than the distance between the second sub power supply line VSL2 and the third sub power supply line VDL1 in the third direction DR3 as illustrated in FIG. 17, it is possible to reduce the occurrence of a burnt failure according to a potential difference between a second power supply voltage of the third sub power supply line VDL1 and a first power supply voltage of the fifth sub power supply line VSL3.

Alternatively, in the fan-out line area FLA, the first sub power supply line VSL1 and the fourth sub power supply line VDL2 may overlap each other as illustrated in FIG. 27. As illustrated in FIG. 27, the first planarization film 160 and the second planarization film 180 may be disposed between the first sub power supply line VSL1 and the fourth sub power supply line VDL2 in the third direction DR3, while as illustrated in FIG. 18, the first planarization film 160 may be disposed between the first sub power supply line VSL1 and the fourth sub power supply line VDL2 in the third direction DR3. When a distance between the first sub power supply line VSL1 and the fourth sub power supply line VDL2 in the third direction DR3 as illustrated in FIG. 27 is greater than the distance between the first sub power supply line VSL1 and the fourth sub power supply line VDL2 in the third direction DR3 as illustrated in FIG. 18, it is possible to reduce the occurrence of a burnt failure according to a potential difference between a second power supply voltage of the third sub power supply line VDL1 and a first power supply voltage of the second sub power supply line VSL2.

Since the first power supply line VSL and the second power supply line VDL overlap each other in the non-display area NDA disposed at the lower side of the display panel 100, the first power supply line VSL or the second power supply line VDL may be disposed between the touch line SL and the data fan-out line DFL or the scan fan-out line SFL. Therefore, it is possible to prevent a parasitic capacitance from being formed between the touch line SL and the data fan-out line DFL and between the touch line SL and the scan fan-out line SFL. Therefore, it is possible to prevent the touch driving signal or the touch sensing signal of the touch line SL from being affected by the data voltage of the data fan-out line DFL or being affected by the scan control signal of the scan fan-out line SFL, and it is thus possible to prevent a touch sensing error from occurring.

The current disclosure should not be construed as being limited to the embodiments set forth herein. Rather, these embodiments are provided so that this disclosure will be thorough and complete and will fully convey the concept of the inventive concept to those skilled in the art.

While the current disclosure have been particularly shown and described with reference to some embodiments thereof, it will be understood by one of ordinary skill in the art that various changes in form and detail may be made therein without departing from the spirit and scope of the current disclosure as defined by the following claims.

What is claimed is:

1. A display device comprising:
a substrate;
a first active layer disposed on the substrate and including a channel region;
a first gate insulating film disposed on the first active layer;
a first gate electrode disposed on the first gate insulating film and overlapping the channel region of the first active layer;
a first interlayer insulating film disposed on the first gate electrode;
a capacitor electrode disposed on the first interlayer insulating film and overlapping the first gate electrode;
a second interlayer insulating film disposed on the capacitor electrode;
a first sub power supply line and a third sub power supply line disposed on the second interlayer insulating film;
a second sub power supply line disposed on the first sub power supply line;
a fourth sub power supply line disposed on the third sub power supply line; and
a first planarization film disposed between the third sub power supply line and the fourth sub power supply line,
wherein at least one of the first sub power supply line and the second sub power supply line overlaps at least one of the third sub power supply line and the fourth sub power supply line.

2. The display device of claim 1, further comprising:
a second planarization film disposed on the fourth sub power supply line.

3. A display device comprising:
a substrate;
a first active layer disposed on the substrate and including a channel region;
a first gate insulating film disposed on the first active layer;
a first gate electrode disposed on the first gate insulating film and overlapping the channel region of the first active layer;
a first interlayer insulating film disposed on the first gate electrode;
a capacitor electrode disposed on the first interlayer insulating film and overlapping the first gate electrode;
a second interlayer insulating film disposed on the capacitor electrode;
a first sub power supply line and a third sub power supply line disposed on the second interlayer insulating film;
a second sub power supply line disposed on the first sub power supply line;
a fourth sub power supply line disposed on the third sub power supply line;
a fifth sub power supply line disposed on the second sub power supply line; and
a first planarization film disposed between the third sub power supply line and the fourth sub power supply line,
wherein at least one of the first sub power supply line and the fifth sub power supply line overlaps at least one of the third sub power supply line and the fourth sub power supply line.

4. The display device of claim 3, further comprising:
a second planarization film disposed on the fourth sub power supply line; and
a third planarization film disposed on the fifth sub power supply line.

5. The display device of claim 4, further comprising:
an encapsulation layer disposed on the third planarization film and including a first encapsulation inorganic film, an encapsulation organic film, and a second encapsulation inorganic film; and
a dam for preventing overflow of the encapsulation organic film, wherein the first sub power supply line, the second sub power supply line, and the fifth sub power supply line overlap the dam.

6. A display device comprising:
a substrate including a display area and a non-display area;
touch electrodes disposed in the display area;
touch lines disposed in the non-display area and connected to the touch electrodes;
a first power supply line disposed in the non-display area and having a first power supply voltage applied thereto, the first power supply line including a first sub power supply line disposed on the substrate, a second sub power supply line disposed on the first sub power supply line, and a fifth sub power supply line disposed on the second sub power supply line;
a second power supply line disposed in the non-display area and having a second power supply voltage applied thereto, the second power supply voltage being higher than the first power supply voltage and wherein the second power supply line includes a third sub power supply line disposed on the substrate, and a fourth sub power supply line;
a first planarization film between the third sub power supply line and the fourth sub power supply line;
a second planarization film disposed on the fourth sub power supply line, wherein the fifth sub power supply line is disposed on the second planarization film;
a dam disposed on the first sub power supply line and the second sub power supply line;
a mask support structure; and
an inorganic encapsulation area between the dam and the mask support structure, and
wherein the second sub power supply line overlaps the mask support structure, and
wherein the second sub power supply line is disposed in the inorganic encapsulation area,
wherein any one of the touch lines overlaps at least one of the first power supply line and the second power supply line, and
a portion of the first power supply line overlaps a portion of the second power supply line.

7. The display device of claim 6, wherein the touch line overlaps the first power supply line and the second power supply line.

8. The display device of claim 6, wherein the touch line overlaps the first power supply line.

9. The display device of claim 6, further comprising:
data lines disposed in the display area; and
data fan-out lines disposed in the non-display area and connected to the data lines,
wherein any one of the data fan-out lines overlaps at least one of the first power supply line and the second power supply line.

10. The display device of claim 9, wherein the data fan-out line overlaps the touch line.

11. The display device of claim 6, further comprising:
scan lines disposed in the display area;
a scan driver disposed in the non-display area and applying scan signals to the scan lines; and
scan fan-out lines disposed in the non-display area and connected to the scan driver,
wherein any one of the scan fan-out lines overlaps at least one of the first power supply line and the second power supply line.

12. The display device of claim 11, wherein the scan fan-out line overlaps the touch line.

13. The display device of claim 6, wherein the second sub power supply line overlaps the third sub power supply line.

14. The display device of claim 6, wherein the first sub power supply line and the third sub power supply line include a same material, and the second sub power supply line and the fourth sub power supply line include the same material.

15. The display device of claim 6, wherein the fifth sub power supply line overlaps the third sub power supply line.

16. The display device of claim 6, wherein the first sub power supply line overlaps the fourth sub power supply line.

17. The display device of claim 16, wherein the first sub power supply line and the third sub power supply line include a same material, and the fifth sub power supply line and the fourth sub power supply line include the same material.

* * * * *